US011792995B2

(12) United States Patent
Lee et al.

(10) Patent No.: US 11,792,995 B2
(45) Date of Patent: Oct. 17, 2023

(54) SEMICONDUCTOR DEVICE INCLUDING FERROELECTRIC LAYER AND METHOD OF MANUFACTURING THE SAME

(71) Applicant: SK hynix Inc., Icheon-si (KR)

(72) Inventors: Jae Gil Lee, Icheon-si (KR); Dong Ik Suh, Icheon-si (KR); Se Ho Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 73 days.

(21) Appl. No.: 17/317,663

(22) Filed: May 11, 2021

(65) Prior Publication Data

US 2022/0189972 A1 Jun. 16, 2022

(30) Foreign Application Priority Data

Dec. 15, 2020 (KR) ........................ 10-2020-0175878

(51) Int. Cl.

| | |
|---|---|
| ***H10B 51/30*** | (2023.01) |
| ***G11C 11/22*** | (2006.01) |
| ***H10B 51/20*** | (2023.01) |
| ***H01L 21/28*** | (2006.01) |
| ***H01L 29/78*** | (2006.01) |
| ***H01L 29/51*** | (2006.01) |

(52) U.S. Cl.

CPC .......... *H10B 51/30* (2023.02); *G11C 11/2255* (2013.01); *H01L 29/40111* (2019.08); *H01L 29/518* (2013.01); *H01L 29/78391* (2014.09); *H10B 51/20* (2023.02)

(58) Field of Classification Search

CPC ......... H01L 27/11553; H01L 27/11585; H01L 27/1159; H01L 27/11597; H01L 29/40111; H01L 29/516; H01L 29/517; H01L 29/518; H01L 29/78391; G11C 11/2255; H10B 51/10; H10B 51/20; H10B 51/30

See application file for complete search history.

(56) References Cited

U.S. PATENT DOCUMENTS

| | | | | |
|---|---|---|---|---|
| 11,171,157 | B1 * | 11/2021 | Lai | H01L 27/11556 |
| 11,282,559 | B1 * | 3/2022 | Tanaka | H01L 27/11597 |
| 2020/0105773 | A1 | 4/2020 | Morris et al. | |
| 2021/0126013 | A1 * | 4/2021 | Lai | H01L 27/1159 |
| 2022/0037362 | A1 * | 2/2022 | Lin | H01L 29/516 |

FOREIGN PATENT DOCUMENTS

| | | | | | |
|---|---|---|---|---|---|
| CN | 107068686 | A * | 8/2017 | H01L 27/11556 |
| EP | 3629329 | A1 * | 4/2020 | G11C 11/223 |
| KR | 101649091 | B1 | 8/2016 | |

* cited by examiner

*Primary Examiner* — Matthew E Warren

(57) ABSTRACT

A semiconductor device according to an embodiment includes a substrate, a bit line structure and a source line structure respectively extending in a direction perpendicular to a surface of the substrate, a semiconductor layer disposed between the bit line structure and the source line structure on a plane parallel to the surface of the substrate, a first ferroelectric layer disposed on a first surface of the semiconductor layer, and a first gate electrode layer disposed on the first ferroelectric layer.

14 Claims, 33 Drawing Sheets

SEMICONDUCTOR DEVICE INCLUDING FERROELECTRIC LAYER AND METHOD OF MANUFACTURING THE SAME

CROSS-REFERENCE TO RELATED APPLICATIONS

The present application claims priority under 35 U.S.C. § 119(a) to Korean Application No. 10-2020-0175878, filed on Dec. 15, 2020 in the Korean Intellectual Property Office, which is incorporated herein by reference in its entirety.

BACKGROUND

1. Technical Field

The present disclosure generally relates to a semiconductor device, and more particularly, to a semiconductor device including a ferroelectric layer and a method of manufacturing the same.

2. Related Art

In general, ferroelectric material refers to a material that has spontaneous electrical polarization in a state in which an external electric field is not applied. Further, in the ferroelectric material, when an external electric field is applied, the electrical polarization may exhibit hysteresis behavior. Accordingly, by controlling the applied external electric field, various polarizations may be reversibly implemented in the ferroelectric material following the hysteresis behavior. This feature may be applied to a semiconductor device that stores signal information in a non-volatile manner.

SUMMARY

A semiconductor device according to an embodiment of the present disclosure may include a substrate, a bit line structure and a source line structure each extending in a direction perpendicular to a surface of the substrate, a semiconductor layer disposed between the bit line structure and the source line structure on a plane parallel to the surface of the substrate, a first ferroelectric layer disposed on a first surface of the semiconductor layer, and a first gate electrode layer disposed on the first ferroelectric layer.

A semiconductor device according to another embodiment of the present disclosure may include a substrate, a bit line structure and a source line structure each extending in a direction perpendicular to a surface of the substrate, and a plurality of unit cell structures electrically connected to the bit line structure and the source line structure. Each of the plurality of unit cell structures may include a semiconductor layer disposed on a plane parallel to the surface of the substrate and in contact with the bit line structure and the source line structure, a first ferroelectric layer disposed on a first surface of the semiconductor layer, and a first gate electrode layer disposed on the first ferroelectric layer to be spaced apart from the bit line structure and the source line structure. The plurality of unit cell structures are disposed to be spaced apart from each other in a direction perpendicular to the surface of the substrate.

Disclosed is a method of manufacturing a semiconductor device according to another embodiment of the present disclosure. In the method, a substrate including a base insulating layer may be provided. A first stack structure may be formed on the base insulating layer, the first stack structure including first and second insulating layers disposed to be spaced apart from each other in a direction perpendicular to a surface of the substrate and a semiconductor layer and at least one sacrificial layer that are disposed between the first and second insulating layers. The first stack structure may be selectively etched on the base insulating layer to form a second stack structure including a first trench and a first recess space, the first trench being formed to expose the base insulating layer, and the first recess space being formed by selectively etching the at least one sacrificial layer in the first trench. A third stack structure including a plurality of material layers disposed in the first recess space of the second stack structure may be formed, the plurality of material layers including an interfacial insulating layer disposed on the semiconductor layer, a ferroelectric layer to cover at least the interfacial insulating layer, and a gate electrode layer disposed on the ferroelectric layer. A fourth stack structure including a bit line structure disposed in the first trench of the third stack structure on the base insulating layer may be formed. The fourth stack structure may be selectively etched on the base insulating layer to form a fifth stack structure including a second trench exposing the base insulating layer, the second trench exposing the semiconductor layer, the interfacial insulating layer, the ferroelectric layer, the gate electrode layer, and the first and second insulating layers on a sidewall surface of the second trench. A sixth stack structure including a source line structure disposed in the second trench of the fifth stack structure may be formed.

DETAILED DESCRIPTION

Figure 1:
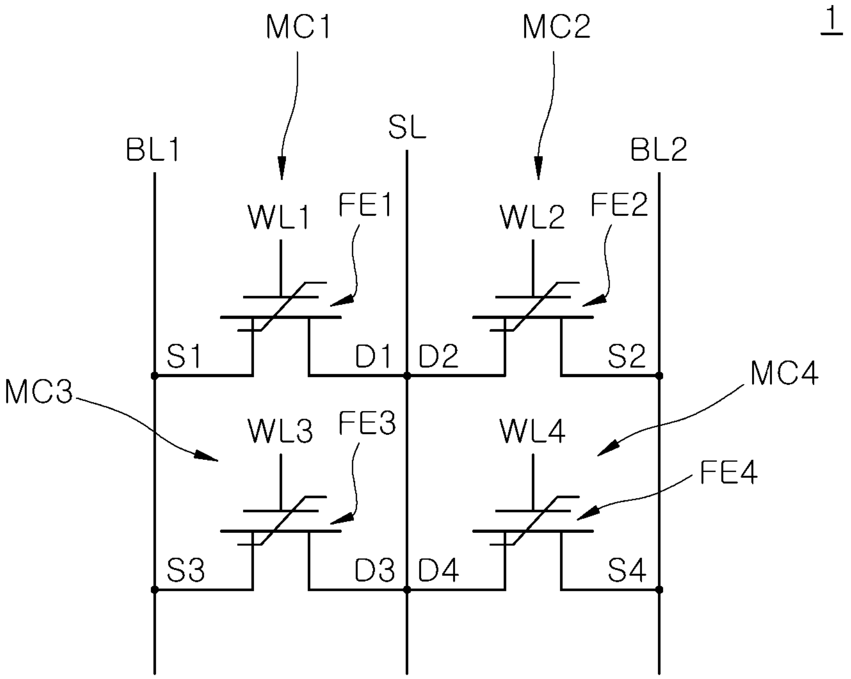
FIG. 1 is a schematic circuit diagram of a semiconductor device according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged.

Overall, the drawings are explained from an observer's point of view, and when an element is referred to as being positioned above another element, this includes all the meanings, including an element that may be positioned directly above another element or an additional element that may be interposed between those elements. The same reference numerals in the plurality of drawings refer to substantially the same elements.

In addition, expression of a singular form of a word should be understood to include the plural forms of the word unless clearly used otherwise in the context. It will be understood that the terms "comprise," "include," or "have" are intended to specify the presence of a feature, a number, a step, an operation, a component, an element, a part, or combinations thereof, but not used to preclude the presence or possibility of adding one or more other features, numbers, steps, operations, components, elements, parts, or combinations thereof. In addition, in performing a method or a manufacturing method, each of the processes constituting the method may occur differently from the specified order unless a specific order is clearly stated in the context. That is, each of the processes may occur in the same order as specified, may be performed substantially simultaneously, or may be performed in a reverse order or a different order.

According to embodiments of the present disclosure, a semiconductor device including a field effect transistor-type unit cell structure including a ferroelectric layer may be provided. The ferroelectric layer may be disposed between a channel region and a gate electrode layer of a field effect transistor. In an embodiment, the semiconductor device may function as a nonvolatile memory device. A write operation of the semiconductor device may be performed by applying a write voltage to the gate electrode layer to write different polarization states in the ferroelectric layer. Different polarization states may be stored in the form of remanent polarization after the write voltage is removed. The stored remanent polarization states may function as signal information. A read operation of the semiconductor device may be performed by reading a threshold voltage of the field effect transistor, which changes according to the size or orientation of the remanent polarization stored in the ferroelectric layer.

FIG. 1 is a schematic circuit diagram of a semiconductor device according to an embodiment of the present disclosure. Referring to FIG. 1, a semiconductor device 1 may include a plurality of unit cells MC1, MC2, MC3, and MC4 disposed between a source line SL and any one of first and second bit lines BL1 and BL2. Although FIG. 1 illustrates the first to fourth unit cells MC1, MC2, MC3, and MC4 as an example of the plurality of unit cells, the plurality of unit cells are not necessarily limited thereto and various numbers of unit cells may be utilized.

Referring to FIG. 1, the first to fourth unit cells MC1, MC2, MC3, and MC4 may be field effect transistor-type memory cells having first to fourth ferroelectric layers FE1, FE2, FE3, and FE4, respectively, as gate dielectric layers. First to fourth word lines WL1, WL2, WL3, and WL4 may be electrically connected to the first to fourth ferroelectric layers FE1, FE2, FE3, and FE4 of the first to fourth unit cells MC1, MC2, MC3, and MC4, respectively.

Source electrodes S1 and S2 of the field effect transistors constituting the first and second unit cells MC1 and MC2 may be electrically connected to the first and second bit lines BL1 and BL2, respectively. Drain electrodes D1 and D2 of the field effect transistors constituting the first and second unit cells MC1 and MC2 may be electrically connected to a common source line SL. That is, the first and second unit cells MC1 and MC2 may share the source line SL.

Source electrodes S3 and S4 of the field effect transistors constituting the third and fourth unit cells MC3 and MC4 may be electrically connected to the first and second bit lines BL1 and BL2, respectively. Drain electrodes D3 and D4 of the field effect transistors constituting the third and fourth unit cells MC3 and MC4 may be electrically connected to the common source line SL. That is, the third and fourth unit cells MC3 and MC4 may share the source line SL.

The circuit configuration of the semiconductor device 1 in FIG. 1 may be applied to semiconductor devices 1*a*, 1*b*, and 1*c* according to embodiments of the present disclosure described below.

Figure 2A:
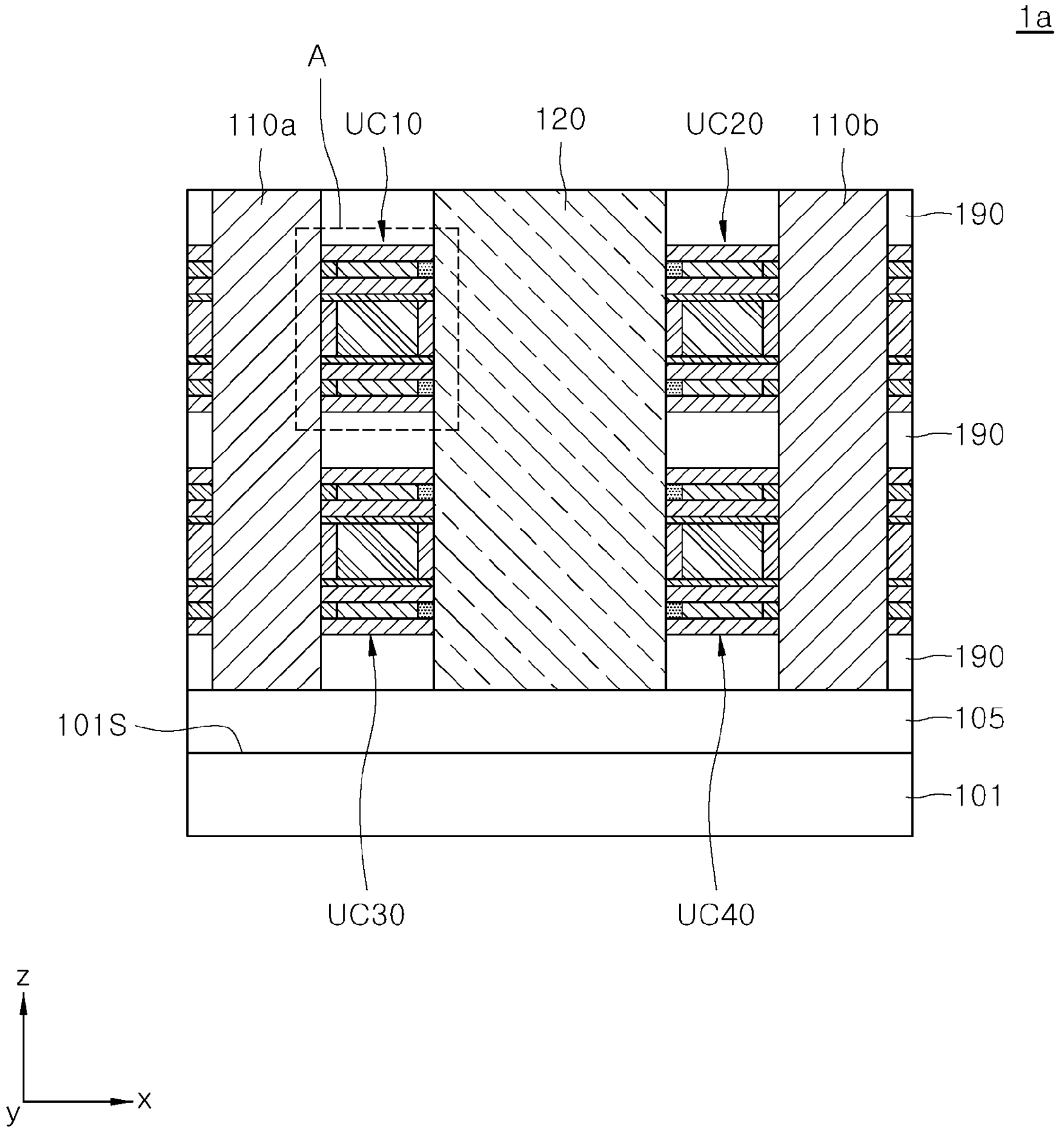
FIG. 2A is a schematic cross-sectional view illustrating a semiconductor device according to an embodiment of the present disclosure.
Figure 2B:
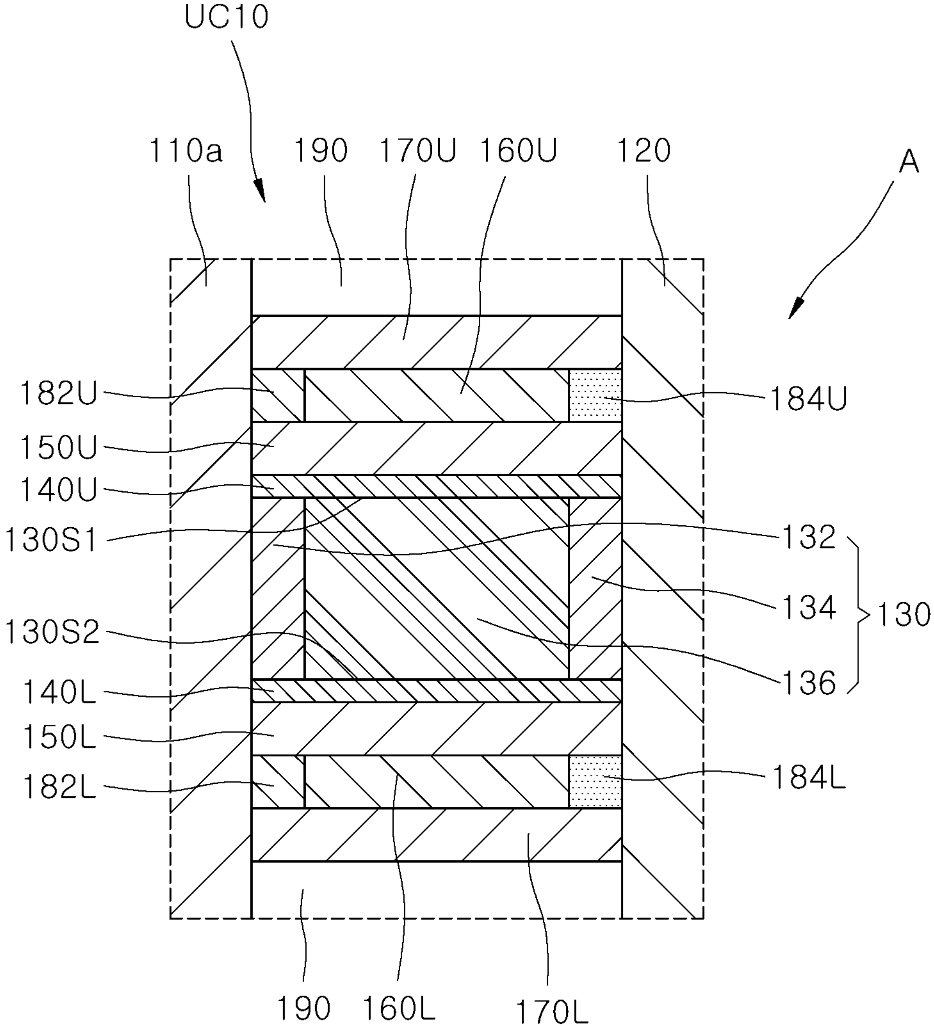
FIG. 2B is an enlarged view of portion "A" of a semiconductor device of FIG. 2A.

FIG. 2A is a schematic cross-sectional view of a semiconductor device according to an embodiment of the present disclosure. FIG. 2B is an enlarged view of portion "A" of a semiconductor device of FIG. 2A.

Referring to FIG. 2A, a semiconductor device 1*a* may include a substrate 101, first and second bit line structures 110*a* and 110*b*, a source line structure 120, and first to fourth unit cell structures UC10, UC20, UC30, and UC40. The first and second bit line structures 110*a* and 110*b* and the source line structure 120 may extend in a first direction (i.e., z-direction) perpendicular to a surface 101S of the substrate 101.

The first and third unit cell structures UC10 and UC30 may be disposed between the first bit line structure 110*a* and the source line structure 120. The first and third unit cell structures UC10 and UC30 may be electrically connected to the first bit line structure 110*a* and the source line structure 120. The first and the third unit cell structures UC10 and UC30 may be disposed to be spaced apart from each other in the first direction (i.e., z-direction). An interlayer insulating layer 190 may be disposed between the first and third unit cell structures UC10 and UC30.

The second and fourth unit cell structures UC20 and UC40 may be disposed between the second bit line structure 110*b* and the source line structure 120. The second and fourth unit cell structures UC20 and UC40 may be electrically connected to the second bit line structure 110*b* and the source line structure 120. The second and fourth unit cell structures UC20 and UC40 may be disposed to be spaced apart from each other in the first direction (i.e., z-direction). The interlayer insulating layer 190 may be disposed between the second and fourth unit cell structures UC20 and UC40.

FIG. 2A illustrates four unit cell structures, but the present disclosure is not limited thereto. Various numbers of unit cell structures may be disposed between the first bit line structure 110*a* and the source line structure 120. Likewise, various numbers of unit cell structures may be disposed between the second bit line structure 110*b* and the source line structure 120.

Referring to FIG. 2A, the substrate 101 may include a semiconductor material. As an example, the semiconductor material may be made of or include silicon (Si), germanium (Ge), gallium arsenide (GaAs), molybdenum selenide (MoSe2), hafnium selenide (HfSe2), indium selenide (InSe), gallium selenide (GaSe), black phosphorus, indium-gallium-zinc oxide (IGZO), or a combination of two or more thereof. The semiconductor material may be doped with a dopant. As an example, the semiconductor material may be doped with an N-type dopant or a P-type dopant.

An integrated circuit may be disposed on the substrate 101. As an example, the integrated circuit may include a driving circuit or a control circuit for the first to fourth unit cell structures UC10, UC20, UC30, and UC40. The integrated circuit may include at least one field effect transistor.

A base insulating layer 105 may be disposed on the substrate 101. The base insulating layer 105 may electrically insulate the first bit line 110*a*, the second bit line 110*b*, and the source line 120 from the substrate 101. The base insulating layer 105 may be made of or include an insulating material. The insulating material may include, for example, oxide, nitride, oxynitride, or a combination of two or more thereof.

The first and second bit line structures 110*a* and 110*b* may be disposed to be spaced apart from each other on the base insulating layer 105. Each of the first and second bit line structures 110*a* and 110*b* may extend in the first direction (i.e., z-direction). The first and second bit line structures 110*a* and 110*b* may correspond to the first and second bit lines BL1 and BL2 in the circuit diagram of FIG. 1.

Each of the first and second bit line structures 110*a* and 110*b* may be a pillar-shaped structure. As an example, the first and second bit line structures 110*a* and 110*b* may be rectangular pillar-shaped structures. Each of the first and second bit line structures 110*a* and 110*b* may be made of or include a conductive material. The conductive material may include, for example, a doped semiconductor, metal, conductive metal nitride, conductive metal carbide, conductive metal silicide, or conductive metal oxide. The conductive material may include, for example, silicon (Si) doped with an n-type or p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. In an embodiment, the first and second bit line structures 110*a* and 110*b* may be made of substantially the same material.

The source line structure 120 may be disposed on the base insulating layer 105. The source line structure 120 may be disposed between the first and second bit line structures 110*a* and 110*b*. The source line structure 120 may extend in the first direction (i.e., z-direction). The source line structure 120 may correspond to the source line SL in the circuit diagram of FIG. 1.

The source line structure 120 may be a pillar-shaped structure. As an example, the source line structure 120 may be a rectangular pillar-shaped structure. The source line structure 120 may be made of or include a conductive material. The conductive material may include, for example, a doped semiconductor, metal, conductive metal nitride, conductive metal carbide, conductive metal silicide, or conductive metal oxide. The conductive material may include, for example, silicon (Si) doped with an n-type or p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

Referring to FIG. 2A, the first to fourth unit cell structures UC10, UC20, UC30, and UC40 may correspond to the first to fourth unit cells MC1, MC2, MC3, and MC4 in the circuit diagram of FIG. 1. Each of the first to fourth unit cell structures U10, U20, U30, and U40 may have substantially the same configuration. Hereinafter, the first unit cell structure UC10 from among the first to fourth unit cell structures U10, U20, U30, and U40 will be described with reference to FIG. 2B. The configurations of the second to fourth unit cell structures U20, U30, and U40 may be apparent from the configuration of the first unit cell structure UC10.

Referring to FIGS. 2A and 2B, a semiconductor layer 130 may be disposed on a plane parallel to the surface 101S of the substrate 101 common to the base insulating layer 105. As an example, the plane parallel to the surface 101S of the substrate 101 may be a plane perpendicular to the first direction (i.e., z-direction). The semiconductor layer 130 may be disposed between the first bit line structure 110*a* and the source line structure 120. In an embodiment, side surfaces of the semiconductor layer 130 may be disposed to contact the first bit line structure 110*a* and the source line structure 120, respectively.

The semiconductor layer 130 may be made of or include a semiconductor material. As an example, the semiconductor material may include silicon (Si), germanium (Ge), gallium arsenide (GaAs), or the like. As another example, the semiconductor material may include a two-dimensional semiconductor material. The two-dimensional semiconductor material may include transition metal dichalcogenide (TMDC), black phosphorous, or the like. The transition metal dichalcogenide (TMDC) may include, for example, molybdenum selenide (MoSe2), hafnium selenide (HfSe2), indium selenide (InSe), gallium selenide (GaSe), or the like. As an example, the semiconductor material may be made of or include metal oxide such as indium-gallium-zinc oxide (IGZO). The semiconductor layer 130 may be doped with an n-type or p-type dopant. The electrical conductivity of the semiconductor layer 130 may vary depending on the amount of the dopant.

The semiconductor layer 130 may include a source region 132 in contact with the first bit line structure 110*a*, a drain region 134 in contact with the source line structure 120, and a channel region 136 disposed between the source region 132 and the drain region 134. The source region 132 and the drain region 134 may be doped with the same type of dopant. The channel region 136 may be doped with a different type of dopant from the source region 132 and the drain region 134. As an example, the source region 132 and the drain region 134 may be doped with an n-type dopant, and the channel region 136 may be doped with a p-type dopant. As another example, the source region 132 and the drain region 134 may be doped with a p-type dopant, and the channel region 136 may be doped with an n-type dopant.

The semiconductor layer 130 may have, facing each other, a first surface 130S1 and a second surface 130S2. A first interfacial insulating layer 140U may be disposed on the first surface 130S1 of the semiconductor layer 130. A first ferroelectric layer 150U may be disposed on the first interfacial insulating layer 140U. A first gate electrode layer 160U may be disposed on the first ferroelectric layer 150U.

The first interfacial insulating layer 140U may be made of or include an insulating material. As an example, the first interfacial insulating layer 140U may be made of or include oxide, nitride, oxynitride, or a combination of two or more thereof. The first interfacial insulating layer 140U may have an amorphous crystal state. The first interfacial insulating layer 140U may serve to reduce interfacial defects that occur when the semiconductor layer 130 and the first ferroelectric layer 150U directly form an interface. In some embodiments, when interfacial stability between the semiconductor layer 130 and the first ferroelectric layer 150U is secured, the first interfacial insulating layer 140U may be omitted.

The first ferroelectric layer 150U may be made of or include a ferroelectric material having remanent polarization. The first ferroelectric layer 150U may include crystalline metal oxide. The first ferroelectric layer 150U may include binary metal oxide. The first ferroelectric layer 150U may include, for example, hafnium oxide, zirconium oxide, hafnium zirconium oxide, or a combination of two or more thereof. In another embodiment, the first ferroelectric layer 150U may include a ternary or higher metal oxide. The first ferroelectric layer 150U may include, for example, Pb(Zr, Ti)$O_3$, $SrBi_2Ta_2O_9$, $(Bi,La)_4Ti_3O_{12}$, $BiFeO_3$, or a combination of two or more thereof.

The first gate electrode layer 160U may be made of or include a conductive material. The first gate electrode layer 160U may include, for example, tungsten (W), titanium (Ti), copper (Cu), aluminum (Al), platinum (Pt), iridium (Ir), ruthenium (Ru), tungsten nitride, titanium nitride, tantalum nitride, iridium oxide, ruthenium oxide, tungsten carbide, titanium carbide, tungsten silicide, titanium silicide, tantalum silicide, or a combination of two or more thereof.

Although not illustrated in FIGS. 2A and 2B, in some embodiments, the first gate electrode layer 160U may extend in a second direction that is not parallel to the first direction. Specifically, the first gate electrode layer 160U may extend in a direction perpendicular to the first direction, which is a direction in which the first bit line structure 110*a* and the source line structure 120 extend. The first gate electrode layer 160U may extend in second direction (e.g., y-direction) on a plane parallel to the surface 101S of the substrate 101. For example, the first gate electrode layer 160U may function as a word line.

Referring again to FIG. 2B, a first bit line insulating layer 182U and a first source line insulating layer 184U may be disposed on the first ferroelectric layer 150U. The first bit line insulating layer 182U and the first source line insulating layer 184U may be disposed on sidewalls of the first gate electrode layer 160U. The first bit line insulating layer 182U may electrically insulate the first bit line structure 110*a* from the first gate electrode layer 160U in the lateral direction (i.e., corresponding to the x-direction of FIG. 2A). The first source line insulating layer 184U may electrically insulate the source line structure 120 from the first gate electrode layer 160U in the lateral direction (i.e., corresponding to the x-direction of FIG. 2A). Each of the first bit line insulating layer 182U and the first source line insulating layer 184U may be made of or include, for example, oxide, nitride, oxynitride, or a combination of two or more thereof.

A first cover dielectric layer 170U may be disposed on the first gate electrode layer 160U, the first bit line insulating layer 182U, and the first source line insulating layer 184U. In an embodiment, the first cover dielectric layer 170U may contact the first gate electrode layer 160U, the first bit line insulating layer 182U, and the first source line insulating layer 184U. In an embodiment, the first cover dielectric layer 170U may be made of substantially the same material as the first ferroelectric layer 150U. That is, the first cover dielectric layer 170U may be made of or include a ferroelectric material having remanent polarization. An interlayer insulating layer 190 may be disposed on the first cover dielectric layer 170U. The interlayer insulating layer 190 may be made of or include, for example, oxide, nitride, oxynitride, or a combination of two or more thereof.

Referring again to FIG. 2B, a second interfacial insulating layer 140L may be disposed on a second surface 130S2 of the semiconductor layer 130. A second ferroelectric layer 150L may be disposed on the second interfacial insulating layer 140L. A second gate electrode layer 160L may be disposed on the second ferroelectric layer 150L. The configurations of the second interface insulating layer 140L, the second ferroelectric layer 150L, and the second gate electrode layer 160L may be substantially the same as those of the first interfacial insulating layer 140U, the first ferroelectric layer 150U, and the first gate electrode layer 160U.

In addition, a second bit line insulating layer 182L and a second source line insulating layer 184L may be disposed on sidewalls of the second gate electrode layer 160L. The second bit line insulating layer 182L may electrically insulate the first bit line structure 110*a* from the second gate electrode layer 160L in the lateral direction (i.e., corresponding to the x-direction of FIG. 2A). The second source line insulating layer 184L may electrically insulate the source line structure 120 from the second gate electrode layer 160L in the lateral direction (i.e., corresponding to the x-direction of FIG. 2A). The configuration of the second bit line insulating layer 182L may be substantially the same as the configuration of the first bit line insulating layer 182U, and the configuration of the second source line insulating layer 184L may be substantially the same as that of the first source line insulating layer 184U.

A second cover dielectric layer 170L may be disposed on the second gate electrode layer 160L, the second bit line insulating layer 182L, and the second source line insulating layer 184L. The configuration of the second cover dielectric layer 170L may be substantially the same as that of the first cover dielectric layer 170U. An interlayer insulating layer 190 may be disposed on the second cover dielectric layer 170L.

In an embodiment, although not illustrated in FIGS. 2A and 2B, the first gate electrode layer 160U and the second gate electrode layer 160L may be electrically connected to each other. As an example, the first gate electrode layer 160U and the second gate electrode layer 160L may be connected to each other through a conductive via (not illustrated), which is disposed in a direction perpendicular to the surface 101S of the substrate 101. Accordingly, in the first unit cell structure UC10, the first and second gate electrode layers 160U and 160L may simultaneously control the polarization of the first and second ferroelectric layers 150U and 150L by simultaneously applying the same gate voltage to the first and second ferroelectric layers 150U and 150L. Accordingly, the same electrical signal may be stored in the first and second ferroelectric layers 150U and 150L. As a result, the first unit cell structure U10 may operate as a single memory cell.

In another embodiment, the first and second gate electrode layers 160U and 160L may be electrically separated from each other. In the first unit cell structure UC10, the first and second gate electrode layers 160U and 160L may control polarization of each of the first and second ferroelectric layers 150U and 150L by applying gate voltages to the first and second ferroelectric layers 150U and 150L independently of each other. Accordingly, separate electrical signals may be stored in the first and second ferroelectric layers 150U and 150L. As a result, the first unit cell structure U10 may operate as two memory cells.

Figure 3A:
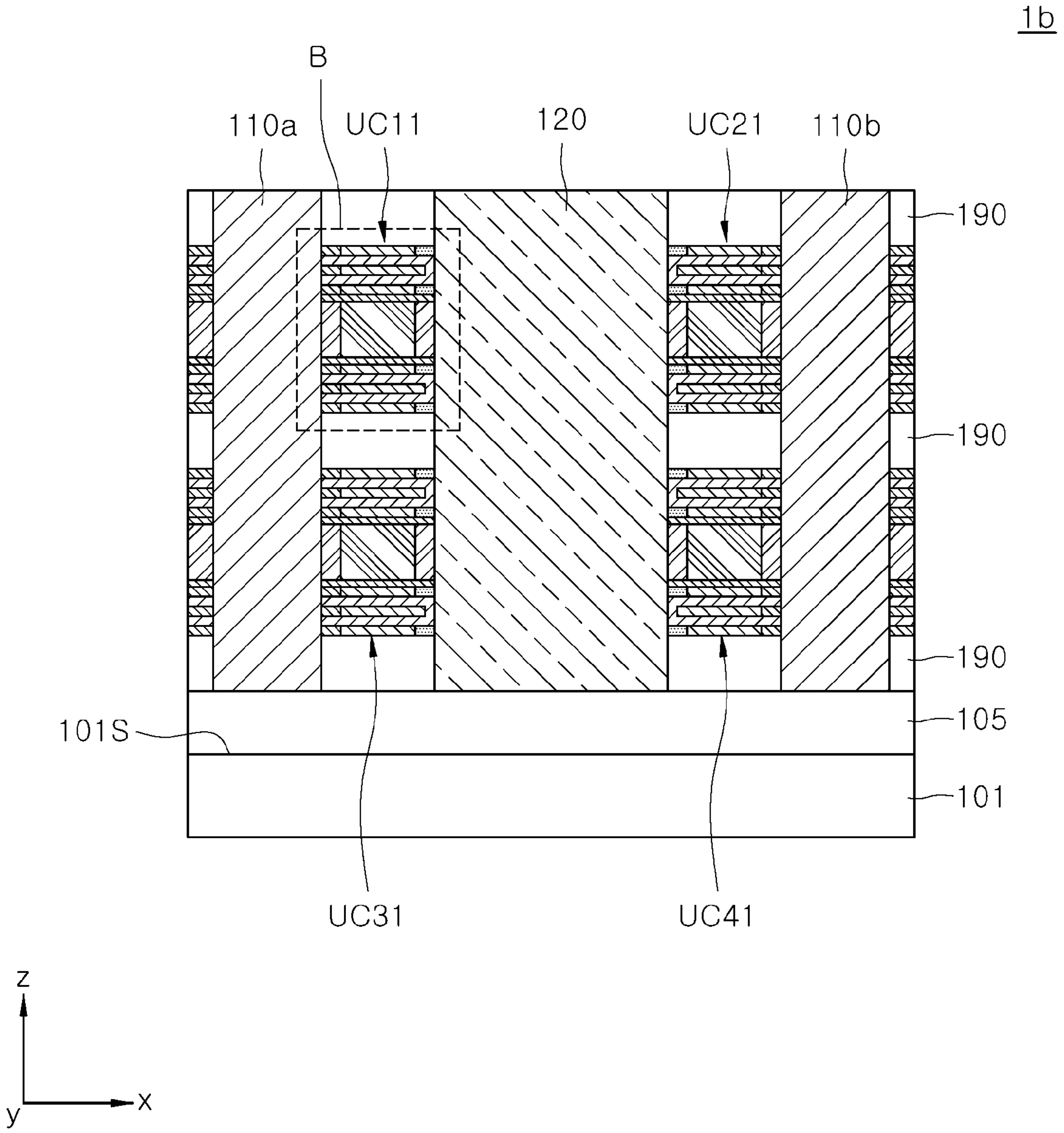
FIG. 3A is a schematic cross-sectional view illustrating a semiconductor device according to another embodiment of the present disclosure.
Figure 3B:
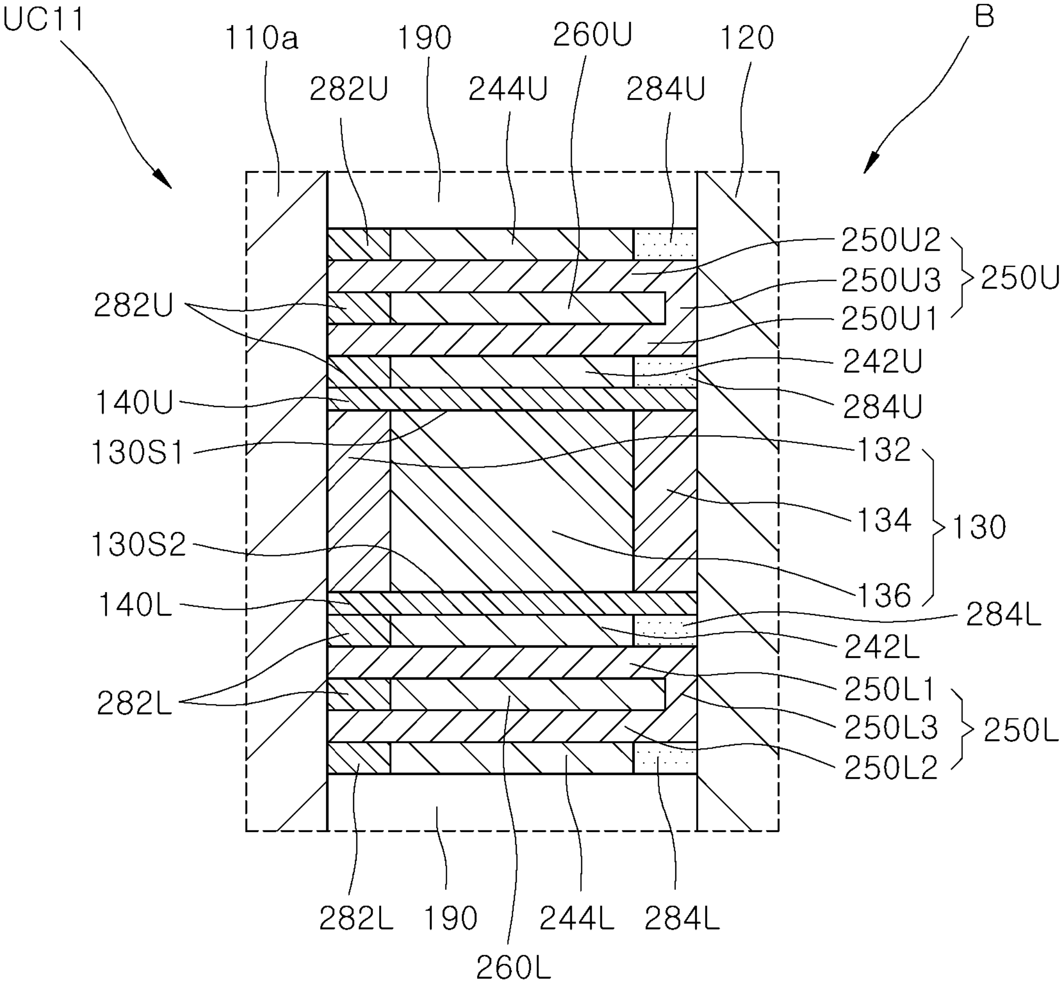
FIG. 3B is an enlarged view of portion "B" of a semiconductor device of FIG. 3A.

FIG. 3A is a schematic cross-sectional view of a semiconductor device according to another embodiment of the present disclosure. FIG. 3B is an enlarged view of portion "B" of a semiconductor device of FIG. 3A. Compared to the semiconductor device 1*a* of FIGS. 2A and 2B, a semiconductor device 1*b* differs in configurations of the first to fourth unit cell structures, namely, UC11, UC21, UC31, and UC41. In FIG. 3A, some elements are substantially the same as like-numbered counterparts in FIG. 2A and therefore some descriptive details may be omitted below.

Referring to FIG. 3A, the first to fourth unit cell structures UC11, UC21, UC31, and UC41 of the semiconductor device 1*b* may correspond to the first to fourth unit cells MC1, MC2, MC3, and MC4 in the circuit diagram of FIG. 1. The configurations of the first to fourth unit cell structures UC11, UC21, UC31, and UC41 may be substantially the same as each other. Hereinafter, the first unit cell structure UC11 from among the first to fourth unit cell structures UC11, UC21, UC31, and UC41 will be described in detail with reference to FIG. 3B.

Referring to FIGS. 3A and 3B, a semiconductor layer 130 may be disposed on a plane parallel to a surface 101S of a substrate 101 on a base insulating layer 105. As an example, the plane parallel to a surface 101S of the substrate 101 may be a plane perpendicular to a first direction (i.e., z-direction).

The semiconductor layer 130 may include a source region 132 in contact with a first bit line structure 110*a*, a drain region 134 in contact with a source line structure 120, and a channel region 136 disposed between the source region 132 and the drain region 134.

A first interfacial insulating layer 140U may be disposed on a first surface 130S1 of the semiconductor layer 130. A first electrically floating layer 242U may be disposed on the first interfacial insulating layer 140U. A first ferroelectric layer 250U may be disposed on the first electrically floating layer 242U. The first ferroelectric layer 250U may have a shape of "⊃", such as for example a rotated horseshoe shape. The first ferroelectric layer 250U may include a first portion 250U1, a second portion 250U2, and a third portion 250U3. The first portion 250U1 and the second portion 250U2 may be disposed to be spaced apart from each other in the z-direction, and the third portion 250U3 may connect the first portion 250U1 and the second portion 250U2 to each other. A first gate electrode layer 260U may be disposed between the first portion 250U1 and the second portion 250U2 of the first ferroelectric layer 250U. A first cover conductive layer 244U may be disposed on the second portion 250U2 of the first ferroelectric layer 250U.

The first electrically floating layer 242U may have electrical conductivity. The first electrically floating layer 242U may be made of or include a conductive material. The conductive material may include, for example, metal, conductive metal nitride, conductive metal oxide, or the like. The first electrically floating layer 242U may be electrically floating in the first unit cell structure UC11.

The first electrically floating layer 242U may form an interface with the first portion 250U1 of the first ferroelectric layer 250U. Meanwhile, when ferroelectric polarization is formed in the first portion 250U1 of the first ferroelectric layer 250U, electric charges induced by the ferroelectric polarization may be distributed inside the first portion 250U1 adjacent to the interface with the first electrically floating layer 242U. The first electrically floating layer 242U may provide a sufficient amount of electric charges of opposite polarities to screen the induced electric charges in an inner region of the first electrically floating layer 242U adjacent to the interface. Accordingly, the electric charges induced in the first ferroelectric layer 250U due to the ferroelectric polarization may be offset by the electric charges provided by the first electrically floating layer 242U. As a result, it is possible to prevent the occurrence of a depolarization electric field in the first ferroelectric layer 250U by the electric charges induced by the ferroelectric polarization. Thereby, it is possible to prevent the ferroelectric polarization of the first ferroelectric layer 250U from deteriorating because of the depolarization electric field.

The first electrically floating layer 242U may be electrically insulated from the first bit line structure 110*a* by a first bit line insulating layer 282U. The first electrically floating layer 242U may be electrically insulated from the source line structure 120 by a first source line insulating layer 284U.

Referring again to FIG. 3B, the first portion 250U1 of the first ferroelectric layer 250U may cover the first electrically floating layer 242U. The first portion 250U1 may substantially perform a function of storing ferroelectric polarization as signal information. The ferroelectric polarization may be controlled by a gate voltage that is provided by the first gate electrode layer 260U and applied between the first gate electrode layer 260U and the semiconductor layer 130.

The second portion 250U2 of the first ferroelectric layer 250U may be disposed between the first gate electrode layer 260U and the first cover conductive layer 244U. The third portion 250U3 of the first ferroelectric layer 250U may be disposed on a sidewall surface of the source line structure 120 to connect the first portion 250U1 and the second portion 250U2 to each other. In an embodiment, the second and third portions 250U2 and 250U3 might not be electrically controlled by a gate voltage provided by the first gate electrode layer 260U between the first gate electrode layer 260U and the semiconductor layer 130. Accordingly, the second and third portions 250U2 and 250U3 might not substantially perform a memory function of storing the ferroelectric polarization as signal information between the first gate electrode layer 260U and the semiconductor layer 130.

The material constituting the first to third portions 250U1, 250U2, and 250U3 of the first ferroelectric layer 250U may be substantially the same as the material constituting the first ferroelectric layer 150U described above with reference to FIGS. 2A and 2B.

The first gate electrode layer 260U may be disposed, in the z-direction, between the first portion 250U1 and the second portion 250U2 of the first ferroelectric layer 250U. In addition, the first gate electrode layer 260U may be disposed, in the x-direction, between a first bit line insulating layer 282U and the third portion 250U3 of the first ferroelectric layer 250U. The material constituting the first gate electrode layer 260U may be substantially the same as the material constituting the first gate electrode layer 160U described above with reference to FIGS. 2A and 2B. The first gate electrode layer 260U may be electrically insulated from the first bit line structure 110*a* by the first bit line insulating layer 282U.

Although not illustrated in FIGS. 3A and 3B, in some embodiments, the first gate electrode layer 260U may extend in a second direction that is not parallel to the first direction (i.e., z-direction). Specifically, the first gate electrode layer 260U may extend in a direction perpendicular to the first direction, which is a direction in which first bit line structure 110*a* and the source line structure 120 extend. The first gate electrode layer 260U may extend in a second direction (e.g., y-direction) on a plane parallel to the surface 101S of the substrate 101. The first gate electrode layer 260U may function as a word line.

The first cover conductive layer 244U may be disposed to contact the second portion 250U2 of the first ferroelectric layer 250U. The first cover conductive layer 244U may be made of or include a conductive material. In an embodiment, the first cover conductive layer 244U may be electrically floating. The first cover conductive layer 244U may be electrically insulated from the first bit line structure 110*a* by a first bit line insulating layer 282U. The first cover conductive layer 244U may be electrically insulated from the source line structure 120 by a first source line insulating layer 284U. An interlayer insulating layer 190 may be disposed on the first cover conductive layer 244U. The interlayer insulating layer 190 may be disposed to contact the first cover conductive layer 244U, the first bit line insulating layer 282U, and the first source line insulating layer 284U.

Referring again to FIG. 3B, a second interfacial insulating layer 140L may be disposed on a second surface 130S2 of the semiconductor layer 130. A second electrically floating layer 242L may be disposed on the second interfacial insulating layer 140L. A second ferroelectric layer 250L may be disposed on the second electrically floating layer 242L. The second ferroelectric layer 250L may have a shape of '⊐', such as a rotated horseshoe shape. The second ferroelectric layer 250L may include a first portion 250L1, a second portion 250L2, and a third portion 250L3. The first portion 250L1 and the second portion 250L2 may be disposed to be spaced apart from each other in the z-direction, and the third portion 250L3 may connect the first portion 250L1 and the second portion 250L2 to each other. A second gate electrode layer 260L may be disposed between the first portion 250L1 and the second portion 250L2 of the second ferroelectric layer 250L. A second cover conductive layer 244L may be disposed on the second portion 250L2 of the second ferroelectric layer 250L.

Second bit line insulating layers 282L may be disposed between the first bit line structure 110*a* and each of the second electrically floating layer 242L, the second gate electrode layer 260L, and the second cover conductive layer 244L. Second source line insulating layers 284L may be disposed between the source line structure 120 and each of the second electrically floating layer 242L and the second cover conductive layer 244L.

An interlayer insulating layer 190 may be disposed on the second cover conductive layer 244L. The interlayer insulating layer 190 may be disposed to contact the second cover conductive layer 244L, the second bit line insulating layer 282L, and the second source line insulating layer 284L.

The configurations of the second interfacial insulating layer 140L, the second electrically floating layer 242L, the second ferroelectric layer 250L, the second gate electrode layer 260L, the second cover conductive layer 244L, the second bit line insulating layer 282L, and the second source line insulating layer 284L may be substantially the same as the configurations of the first interfacial insulating layer 140U, the first electrically floating layer 242U, the first ferroelectric layer 250U, the first gate electrode layer 260U, the first cover conductive layer 244U, the first bit line insulating layer 282U, and the first source line insulating layer 284U.

In an embodiment, although not illustrated in FIGS. 3A and 3B, the first gate electrode layer 260U and the second gate electrode layer 260L may be electrically connected to each other. As an example, the first gate electrode layer 260U and the second gate electrode layer 260L may be connected to each other through a conductive via (not illustrated) disposed in a direction perpendicular to the surface 101S of the substrate 101. The first and second gate electrode layers 260U and 260L provide the same gate voltage to simultaneously control the polarization of the first and second ferroelectric layers 250U and 250L, so that the first unit cell structure UC11 may operate as a single memory cell.

In another embodiment, the first and second gate electrode layers 260U and 260L may be electrically separated from each other. The first and second gate electrode layers 260U and 260L each provide a gate voltage to independently control the polarization of the corresponding first and second ferroelectric layers 250U and 250L, so that the first unit cell structure UC11 may operate as two memory cells.

Figure 4A:
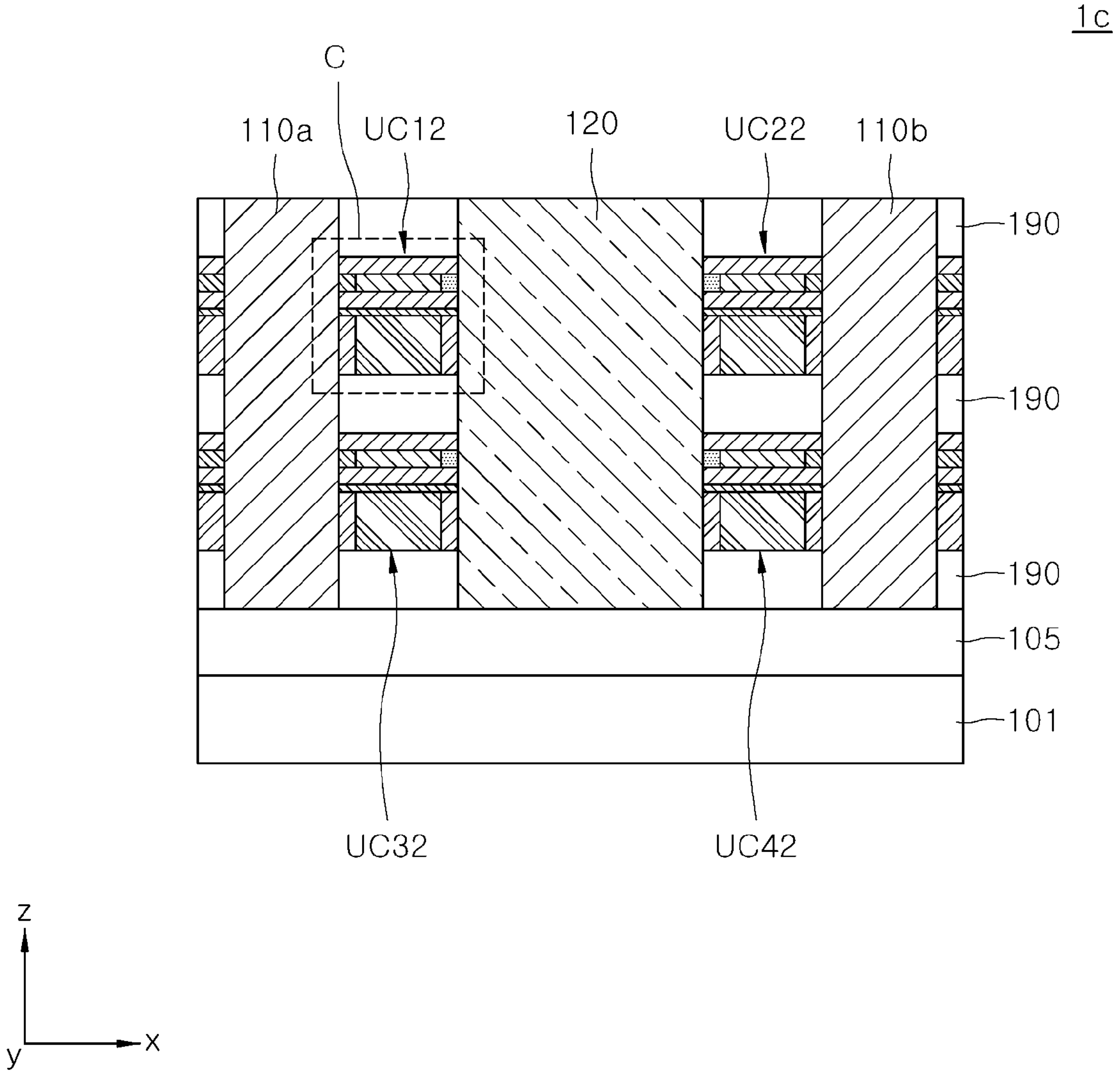
FIG. 4A is a schematic cross-sectional view illustrating a semiconductor device according to yet another embodiment of the present disclosure.
Figure 4B:
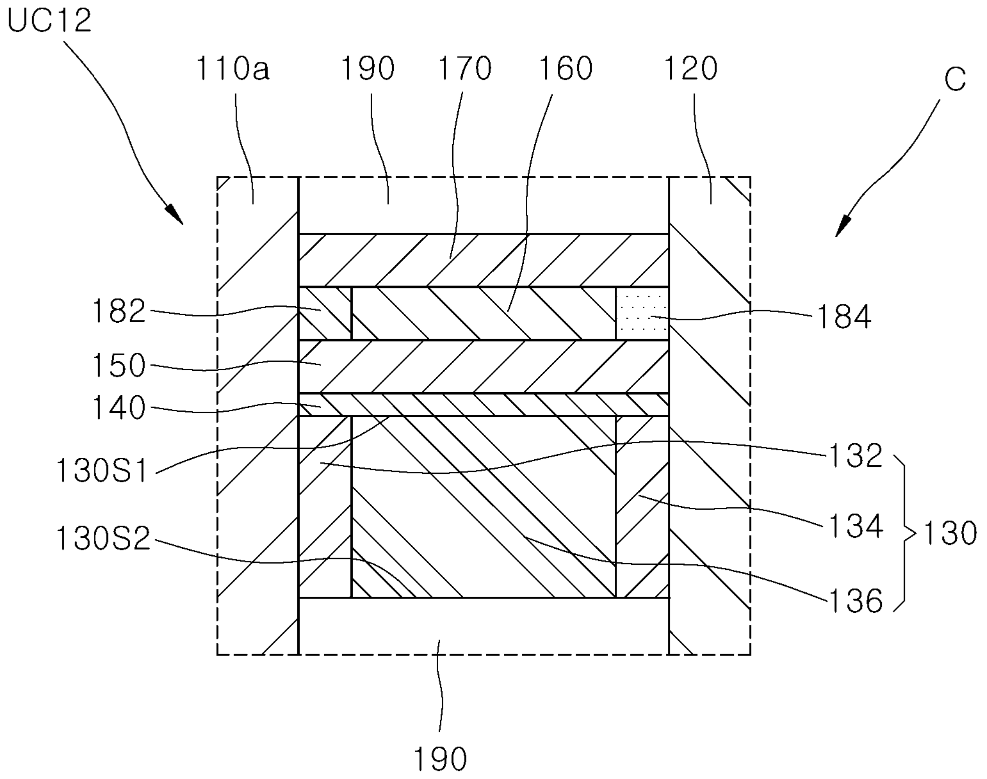
FIG. 4B is an enlarged view of portion "C" of a semiconductor device of FIG. 4A.

FIG. 4A is a schematic cross-sectional view illustrating a semiconductor device according to yet another embodiment of the present disclosure. FIG. 4B is an enlarged view of portion "C" of a semiconductor device of FIG. 4A. Compared to the semiconductor device 1*a* of FIGS. 2A and 2B, a semiconductor device 1*c* differs in configurations of first to fourth unit cell structures, namely, UC12, UC22, UC32, and UC42. In FIG. 4A, some elements are substantially the same as like-numbered counterparts in FIG. 2A and therefore some descriptive details may be omitted below.

Referring to FIG. 4A, the first to fourth unit cell structures UC12, UC22, UC32, and UC42 of the semiconductor device 1*c* may correspond to the first to fourth unit cells MC1, MC2, MC3, and MC4 in the circuit diagram of FIG. 1. The configurations of the first to fourth unit cell structures UC12, UC22, UC32, and UC42 may be substantially the same as each other. Hereinafter, among the first to fourth unit cell structures UC12, UC22, UC32, and UC42, the first unit cell structure UC12 will be described in detail with reference to FIG. 4B.

Referring to FIG. 4B, the first unit cell structure UC12 may include an interfacial insulating layer 140, a ferroelectric layer 150, a gate electrode layer 160, and a cover dielectric layer 170 that are disposed on a first surface 130S1 of a semiconductor layer 130. In addition, the first unit cell structure UC12 may include a bit line insulating layer 182 and a source line insulating layer 184 that are disposed on sidewalls of the gate electrode layer 160. The bit line insulating layer 182 and the source line insulating layer 184 are disposed only over the first surface 130S1 of the semiconductor layer 130. Interlayer insulating layers 190 may be disposed on a second surface 130S2 of the semiconductor layer 130 and on the cover dielectric layer 170.

The configurations of the interfacial insulating layer 140, the ferroelectric layer 150, the gate electrode layer 160, the cover dielectric layer 170, the bit line insulating layer 182, and the source line insulating layer 184 may be substantially the same as the configurations of the first interfacial insulating layer 140U, the first ferroelectric layer 150U, the first gate electrode layer 160U, the first cover dielectric layer 170U, the first bit line insulating layer 182U, and the first source line insulating layer 184U described with reference to FIGS. 2A and 2B.

As described above, in various embodiments of the present disclosure, each of the semiconductor devices may include unit cell structures disposed between the bit line structure and the source line structure, which extend in a vertical direction perpendicular to the surface of the substrate. The unit cell structure may be implemented as a field effect transistor-type ferroelectric device on a plane parallel to the surface of the substrate.

Because the field effect transistor-type ferroelectric device is disposed on a plane parallel to the surface of the substrate, the height of the unit cell structure along the direction perpendicular to the surface of the substrate may be reduced. Accordingly, the density of the unit cell structures that are vertically stacked in a fixed volume on the surface of the substrate may be increased. In addition, as the height of the unit cell structure decreases, when a plurality of unit cell structures are stacked on the substrate, the stress of the substrate may be reduced because the stress of the substrate depends on the heights of the plurality of unit cell structures.

FIGS. 5 to 19 are schematic cross-sectional views illustrating a method of manufacturing a semiconductor device according to an embodiment of the present disclosure. The methods described with reference to FIGS. 5 to 19 may be applied to a manufacturing method of the semiconductor device 1*a* described with reference to FIGS. 2A and 2B.

In an embodiment, the method of manufacturing a semiconductor device may include forming a first stack structure 10 (FIG. 5), forming a second stack structure 20 (FIGS. 6 and 7), forming a third stack structure 30 (FIGS. 8 to 13), forming a fourth stack structure 40 (FIG. 14), forming a fifth stack structure 50 (FIG. 15), and forming a sixth stack structure 60 (FIGS. 16 to 19).

Figure 5:
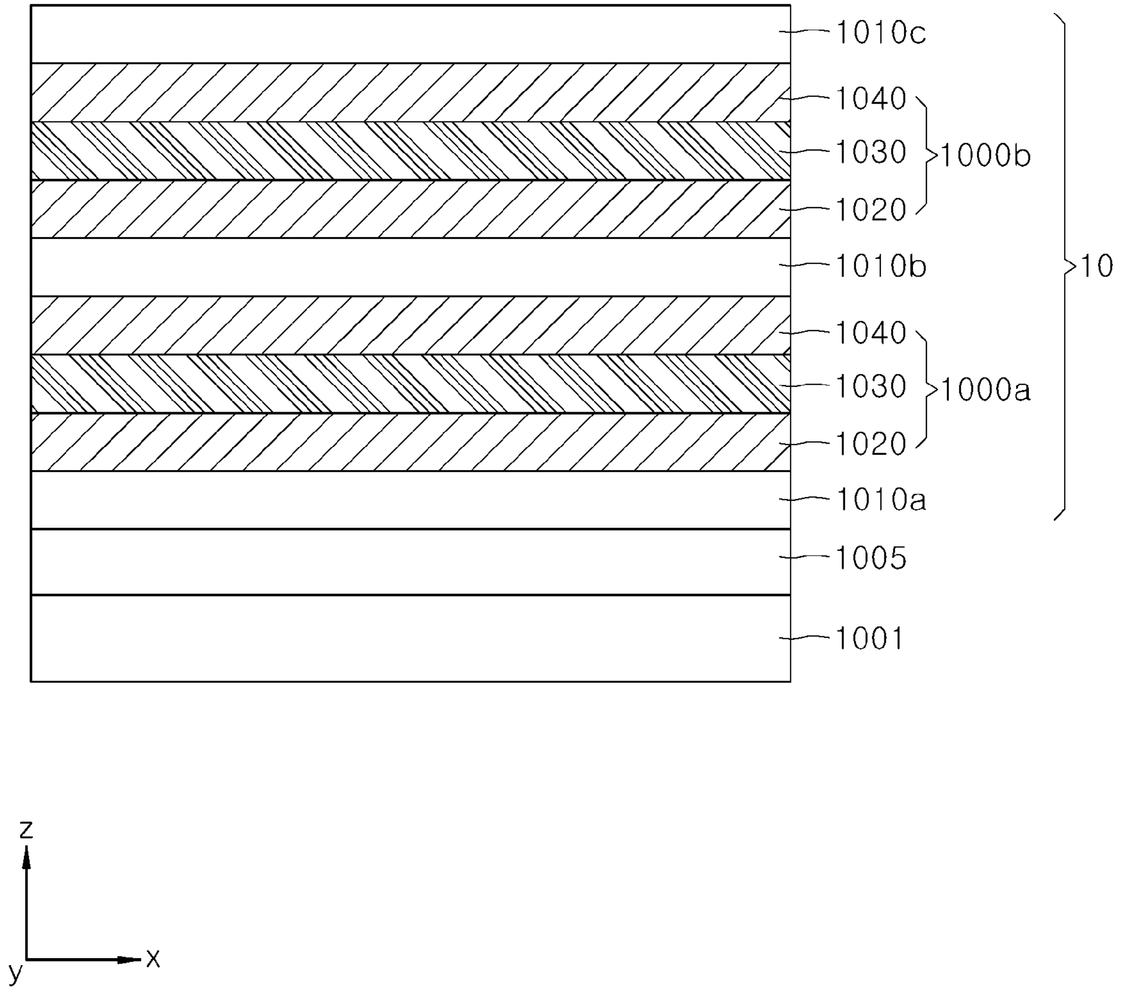
FIGS. 5 to 19 are schematic cross-sectional views illustrating a method of manufacturing a semiconductor device according to an embodiment of the present disclosure.

Referring to FIG. 5, a substrate 1001 may be provided. The substrate 1001 may be substantially the same as a substrate 101 described above with reference to FIGS. 2A and 2B.

Next, a base insulating layer 1005 may be formed on the substrate 1001. The base insulating layer 1005 may be substantially the same as a base insulating layer 105 described above with reference to FIGS. 2A and 2B. The base insulating layer 1005 may be formed by applying, for example, a chemical vapor deposition method, a sputtering method, an atomic layer deposition method, or the like.

Subsequently, a first insulating layer 1010*a* may be formed on the base insulating layer 1005. The first insulating layer 1010*a* may be formed of or include an insulating material. The insulating material may include, for example, oxide, nitride, or oxynitride. The first insulating layer 1010*a* may be formed by applying, for example, a chemical vapor deposition method, a sputtering method, an atomic layer deposition method, or the like.

Subsequently, a first sub-structure 1000*a* may be formed on the first insulating layer 1010*a*. The first sub-structure 1000*a* may include a first sacrificial layer 1020 formed on the first insulating layer 1010*a*, a semiconductor layer 1030 formed on the first sacrificial layer 1020, and a second sacrificial layer 1040 formed on the semiconductor layer 1030.

In an embodiment, the configurations of the first and second sacrificial layers 1020 and 1040 may be substantially the same as each other. For example, each of the first and second sacrificial layers 1020 and 1040 may have etching selectivity with respect to the base insulating layer 1005, the first insulating layer 1010*a*, and the semiconductor layer 1030. Each of the first and second sacrificial layers 1020 and 1040 may be formed of or include, for example, oxide, nitride, or oxynitride. The first and second sacrificial layers 1020 and 1040 may be formed by applying a chemical vapor deposition method, a sputtering method, an atomic layer deposition method, or the like.

In an embodiment, the semiconductor layer 1030 may be formed of or include a semiconductor material. As an example, the semiconductor material may include silicon (Si), germanium (Ge), gallium arsenide (GaAs), or the like. As another example, the semiconductor material may include a two-dimensional semiconductor material. The two-dimensional semiconductor material may include transition metal dichalcogenide (TMDC), black phosphorus, or the like. The transition metal dichalcogenide (TMDC) may include, for example, molybdenum selenide (MoSe2), hafnium selenide (HfSe2), indium selenide (InSe), gallium selenide (GaSe), or the like. The semiconductor material may include, for example, a metal oxide such as indium-gallium-zinc oxide (IGZO). The semiconductor layer 1030 may be doped with an n-type dopant or a p-type dopant. The electrical conductivity of the semiconductor layer 1030 may vary depending on the amount of the dopant. The semiconductor layer 1030 may be formed by applying, for example, a chemical vapor deposition method, a sputtering method, an atomic layer deposition method, or the like. In an embodiment, when the first insulating layer 1010*a* is an oxide layer, the first and second sacrificial layers 1020 and 1040 may be nitride layers, and the semiconductor layer 1030 may be a semiconductor material layer doped with a dopant.

Next, a second insulating layer 1010*b* may be formed on the first sub-structure 1000*a*. The configuration and method of manufacturing the second insulating layer 1010*b* may be substantially the same as the configuration and manufacturing method of the first insulating layer 1010*a*.

Consequently, a second sub-structure 1000*b* may be formed on the second insulating layer 1010*b*. The configuration of the second sub-structure 1000*b* may be substantially the same as the configuration of the first sub-structure 1000*a*. The second sub-structure 1000*b* may include a first sacrificial layer 1020 formed on the second insulating layer 1010*b*, a semiconductor layer 1030 formed on the first sacrificial layer 1020, and a second sacrificial layer 1040 formed on the semiconductor layer 1030. The method of manufacturing the second sub-structure 1000*b* may be substantially the same as the manufacturing method of the first sub-structure 1000*a*.

Subsequently, a third insulating layer 1010*c* may be formed on the second sub-structure 1000*b*. The configuration and method of manufacturing the third insulating layer 1010*c* may be substantially the same as the configuration and manufacturing method of the first insulating layer 1010*a*. The first stack structure 10 may be formed by performing the processes described above related to FIG. 5.

Figure 6:
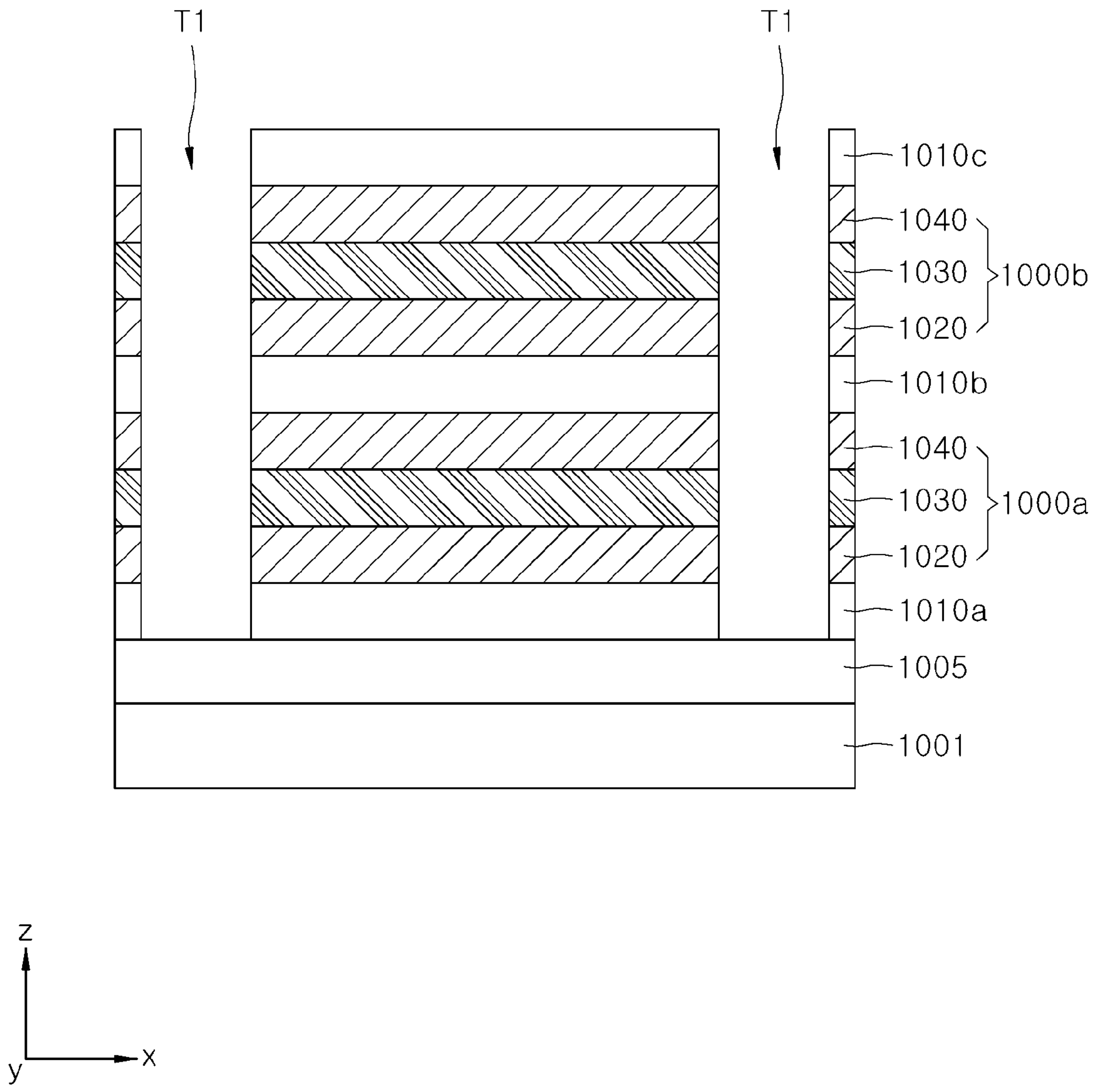

Referring to FIG. 6, first trenches T1 exposing the base insulating layer 1005 may be formed by selectively etching the first stack structure 10 of FIG. 5 on the base insulating layer 1005. The first trenches T1 may be formed by applying an anisotropic etching process. In an embodiment, each of the first trenches T1 may be a hole-shaped pattern.

Figure 7:
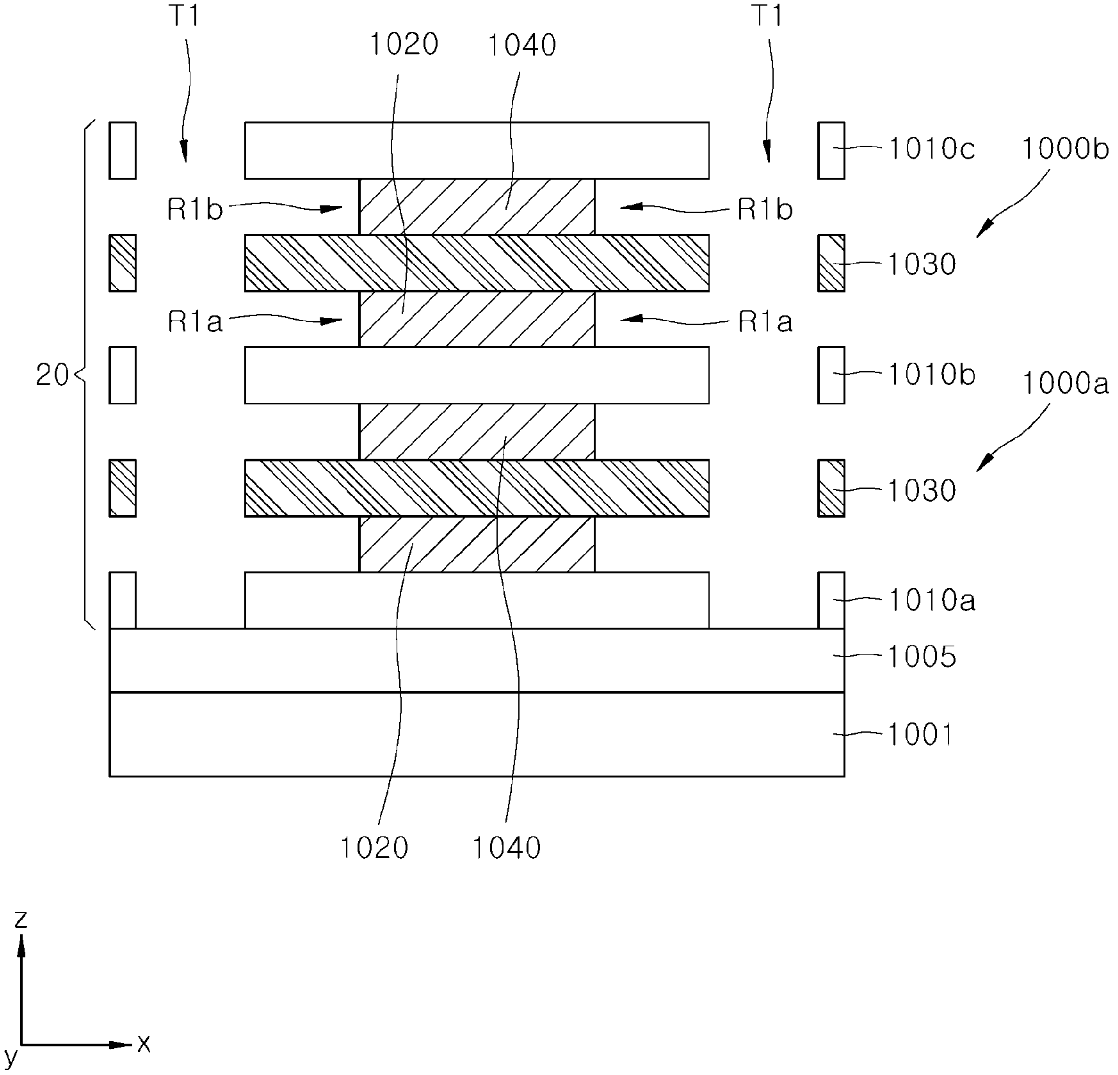

Referring to FIG. 7, the first and second sacrificial layers 1020 and 1040 may be selectively etched in the first trenches T1 to form first recess spaces R1*a* and R1*b*. The first recess spaces R1*a* and R1*b* may include first side spaces R1*a* formed by etching first sacrificial layers 1020 and second side spaces R1*b* formed by etching second sacrificial layers 1040.

In an embodiment, the first recess spaces R1*a* and R1*b* may be formed by providing an etchant into the first trenches T1 to isotropically etch the first and second sacrificial layers 1020 and 1040. The isotropic etching may be performed using the etching selectivity of the first and second sacrificial layers 1020 and 1040 with respect to the base insulating layer 1005, the semiconductor layer 1030, and the first to third insulating layers 1010*a*, 1010*b*, and 1010*c*. As described above, the second stack structure 20 may be formed by performing the processes related to FIGS. 6 and 7.

Figure 8:
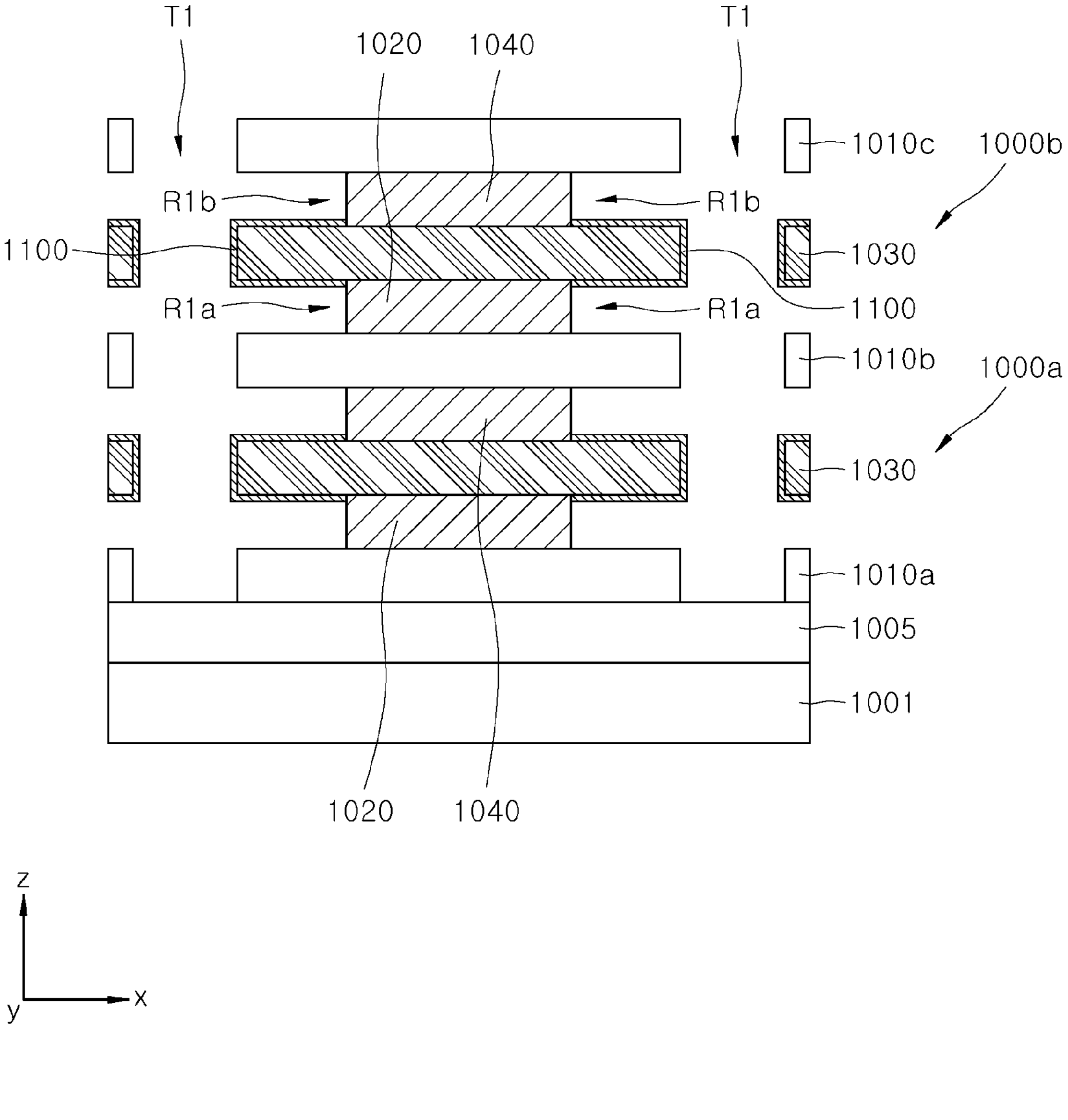

Referring to FIG. 8, interfacial insulating material layers 1100 may be formed on the semiconductor layers 1030. The interfacial insulating material layers 1100 may be formed of or include, for example, oxide, nitride, oxynitride, or the like. In an embodiment, the interfacial insulating material layers 1100 may be formed by a chemical vapor deposition method, a sputtering method, an atomic layer deposition method, or the like. In some embodiments, the interfacial insulating material layers 1100 may be formed by oxidizing the semiconductor layer 1030.

Figure 9:
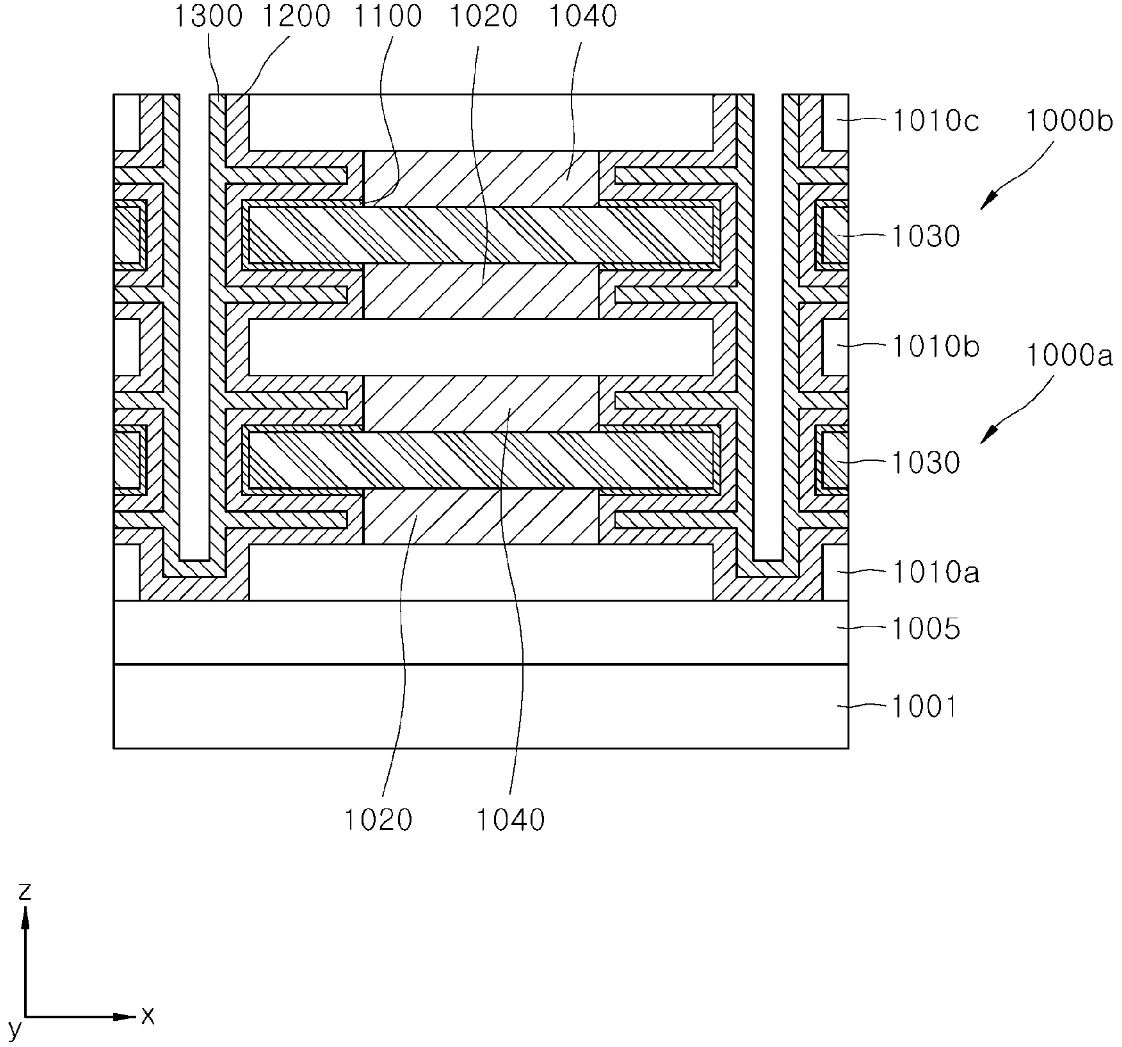

Referring to FIG. 9, a ferroelectric layer 1200 may be formed along inner surfaces of the first trenches T1. The ferroelectric layer 1200 may be formed of or include a ferroelectric material. In an embodiment, the ferroelectric material may include a binary metal oxide. As an example, the binary metal oxide may include hafnium oxide, zirconium oxide, hafnium zirconium oxide, or a combination of two or more thereof. In another embodiment, the ferroelectric material may include a ternary or higher metal oxide. The ternary or higher metal oxide may include, for example, $Pb(Zr,Ti)O_3$, $SrBi_2Ta_2O_9$, $(Bi,La)_4Ti_3O_{12}$, $BiFeO_3$, or a combination of two or more thereof. The ferroelectric layer 1200 may be formed by, for example, a chemical vapor deposition method, an atomic layer deposition method, or the like.

Subsequently, a gate electrode layer 1300 may be formed on the ferroelectric layer 1200. The gate electrode layer 1300 may be formed of or include, for example, a conductive material. The conductive material may include, for example, tungsten (W), titanium (Ti), copper (Cu), aluminum (Al), platinum (Pt), iridium (Ir), ruthenium (Ru), tungsten nitride, titanium nitride, tantalum nitride, iridium oxide, ruthenium oxide, tungsten carbide, titanium carbide, tungsten silicide, titanium silicide, tantalum silicide, or a combination of two or more thereof. The gate electrode layer 1300 may be formed by, for example, a chemical vapor deposition method, an atomic layer deposition method, or the like.

Figure 10:
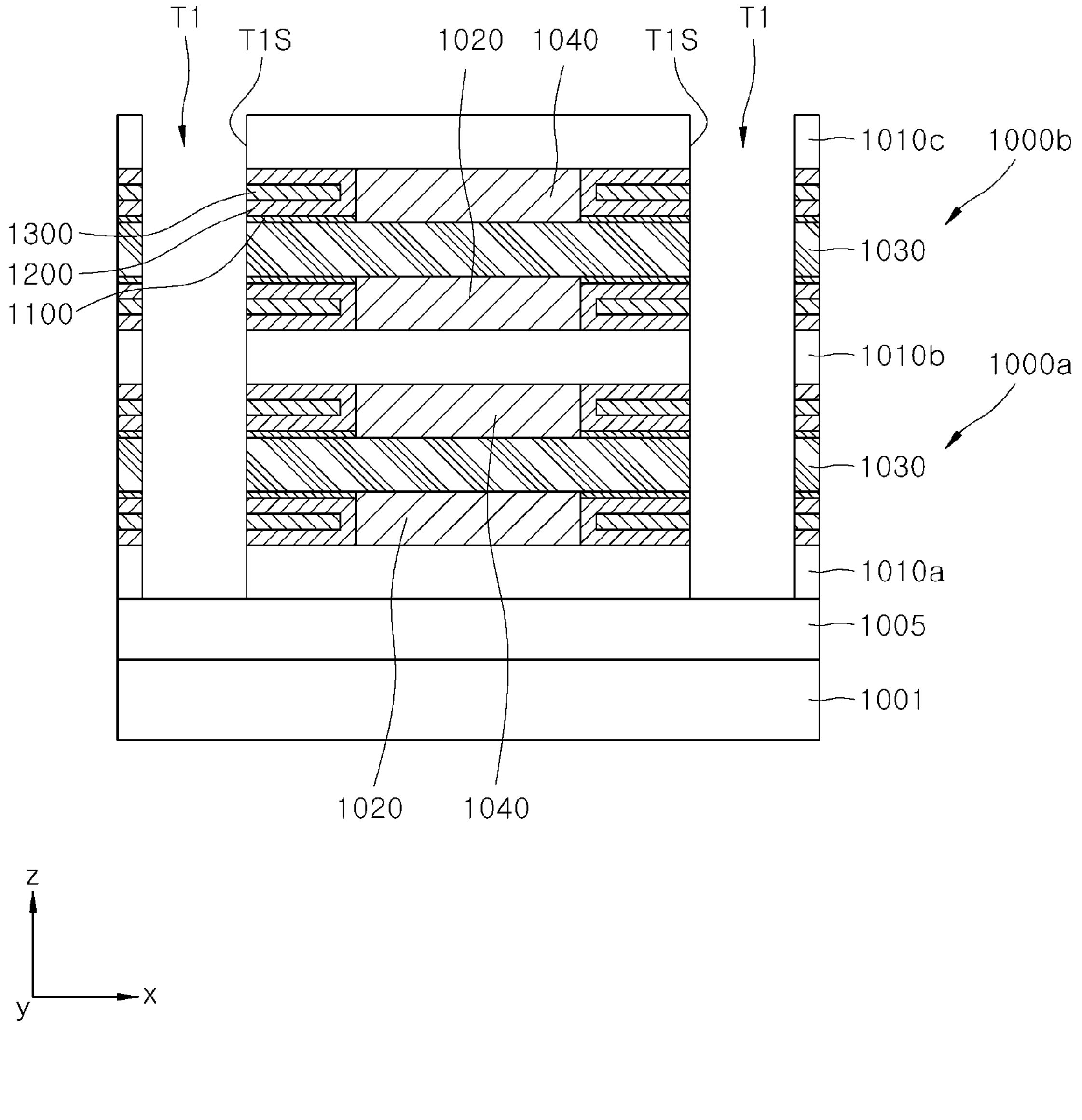

Referring to FIG. 10, the interfacial insulating layers 1100, the ferroelectric layer 1200, and the gate electrode layer 1300 in each of the first trenches T1 may be selectively removed by applying an anisotropic etching method. Accordingly, the interfacial insulating layers 1100, the semiconductor layers 1030, the ferroelectric layer 1200, the gate electrode layer 1300, and the first to third insulating layers 1010*a*, 1010*b*, and 1010*c* may be exposed to the sidewall surfaces T1S of the first trenches T1.

Figure 11:
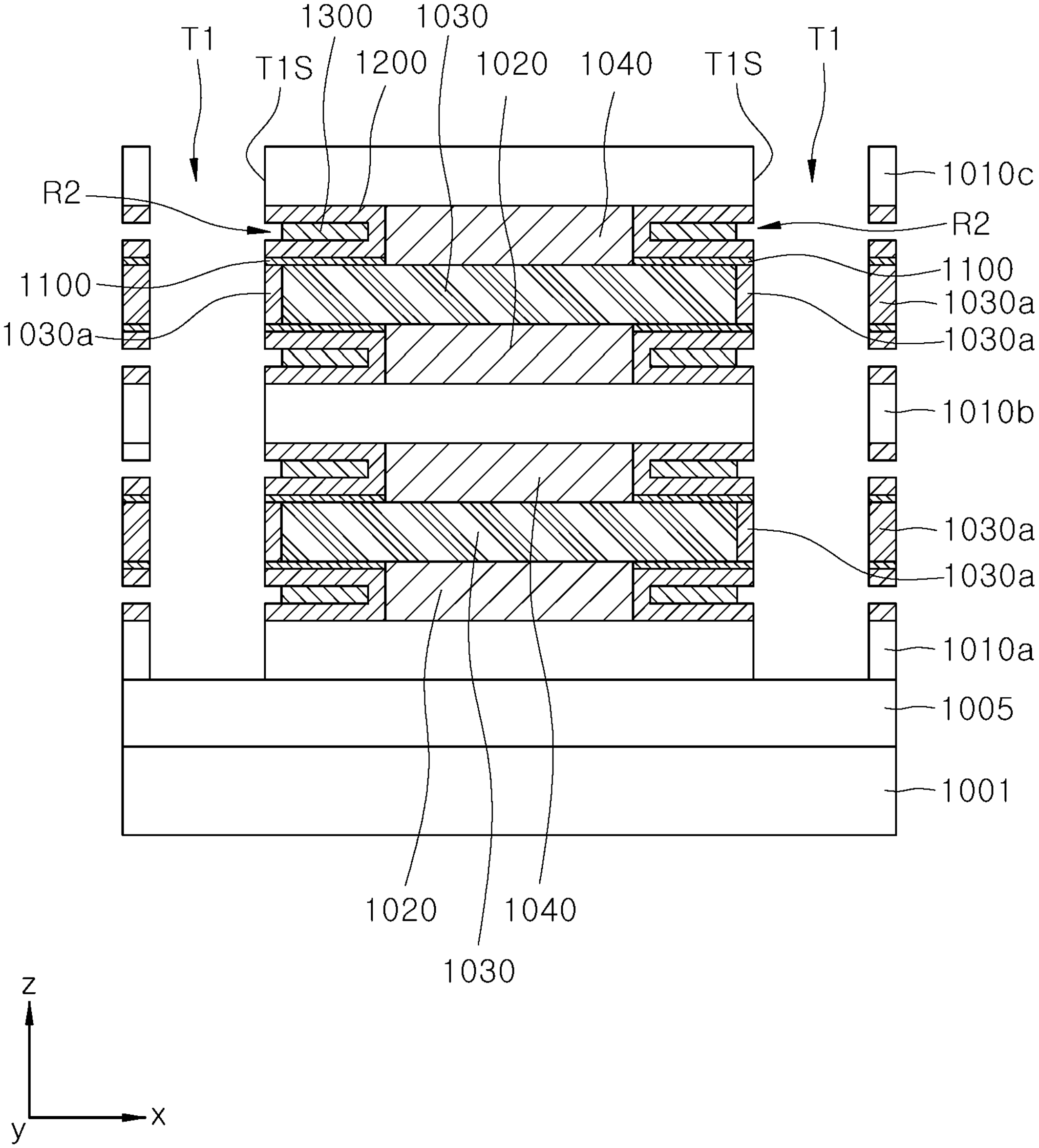

Referring to FIG. 11, the gate electrode layer 1300 exposed on the sidewall surfaces T1S of the first trenches T1 may be selectively etched to form second recess spaces R2. The second recess spaces R2 may be formed by applying an isotropic etching method. In addition, portions of the semiconductor layers 1030 exposed to the sidewall surfaces T1S of the first trenches T1 may be doped to form first semiconductor doped regions 1030*a*. The first semiconductor doped regions 1030*a* may be formed by implanting an n-type dopant or a p-type dopant using an ion implantation method.

Figure 12:
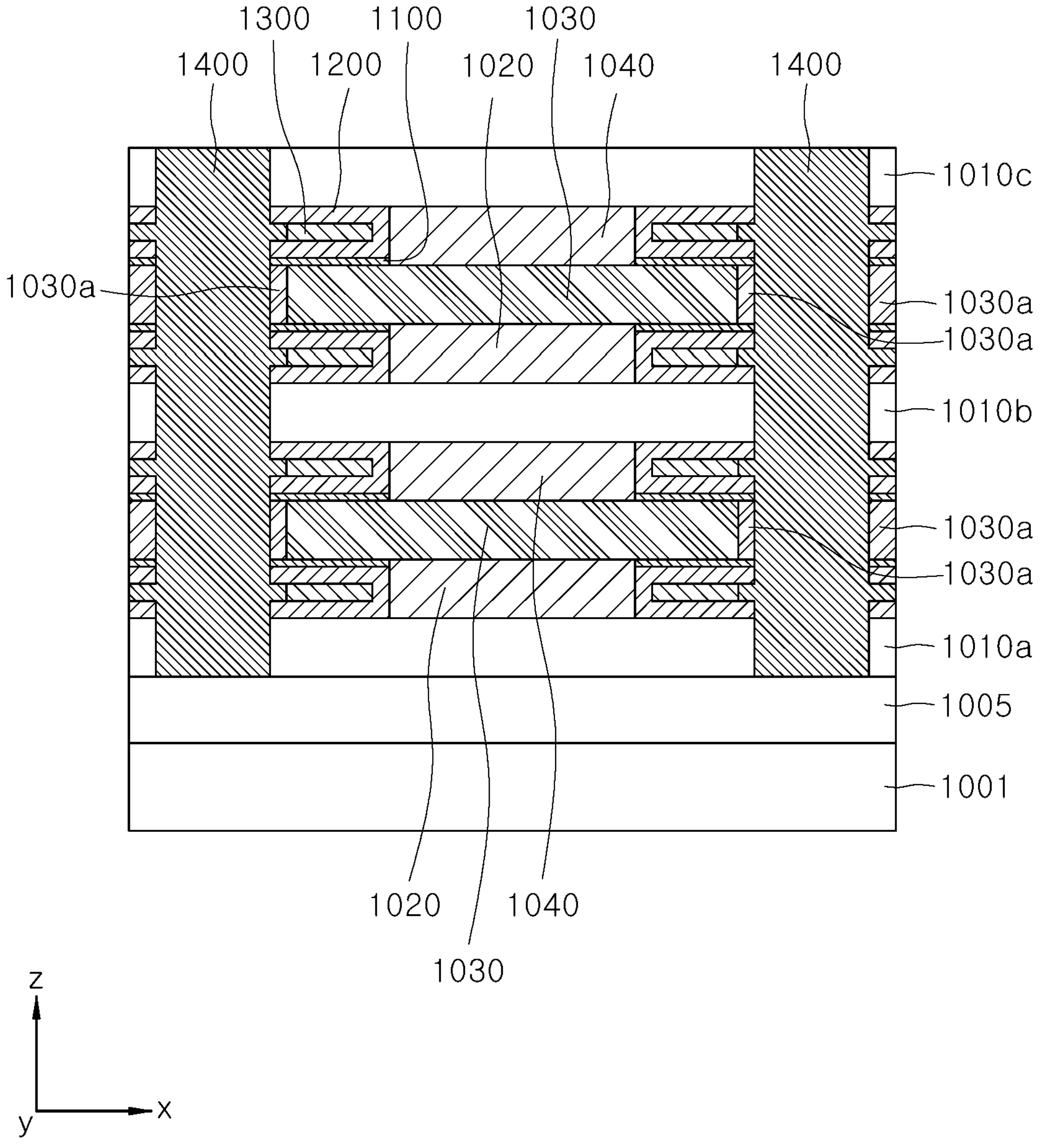
Figure 13:
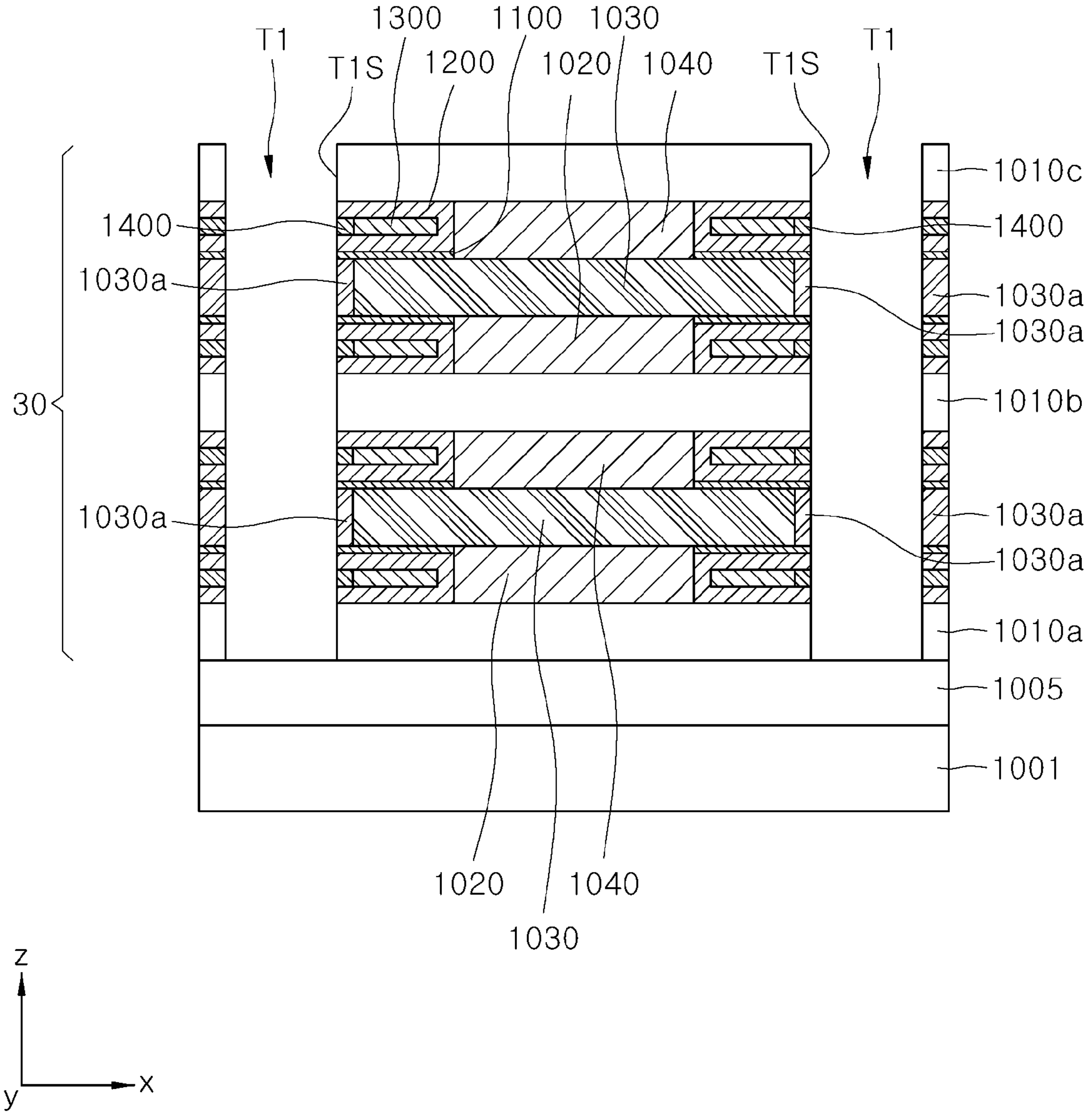

Referring to FIG. 12, the second recess spaces R2 and the first trenches T1 may be filled with an insulating material 1400. Referring to FIG. 13, the insulating material 1400 inside the first trenches T1 may be removed by applying an anisotropic etching method. Accordingly, the insulating material 1400 may remain in the second recess spaces R2. As described above, the third stack structure 30 may be formed by performing the processes related to FIGS. 8 to 13.

Figure 14:
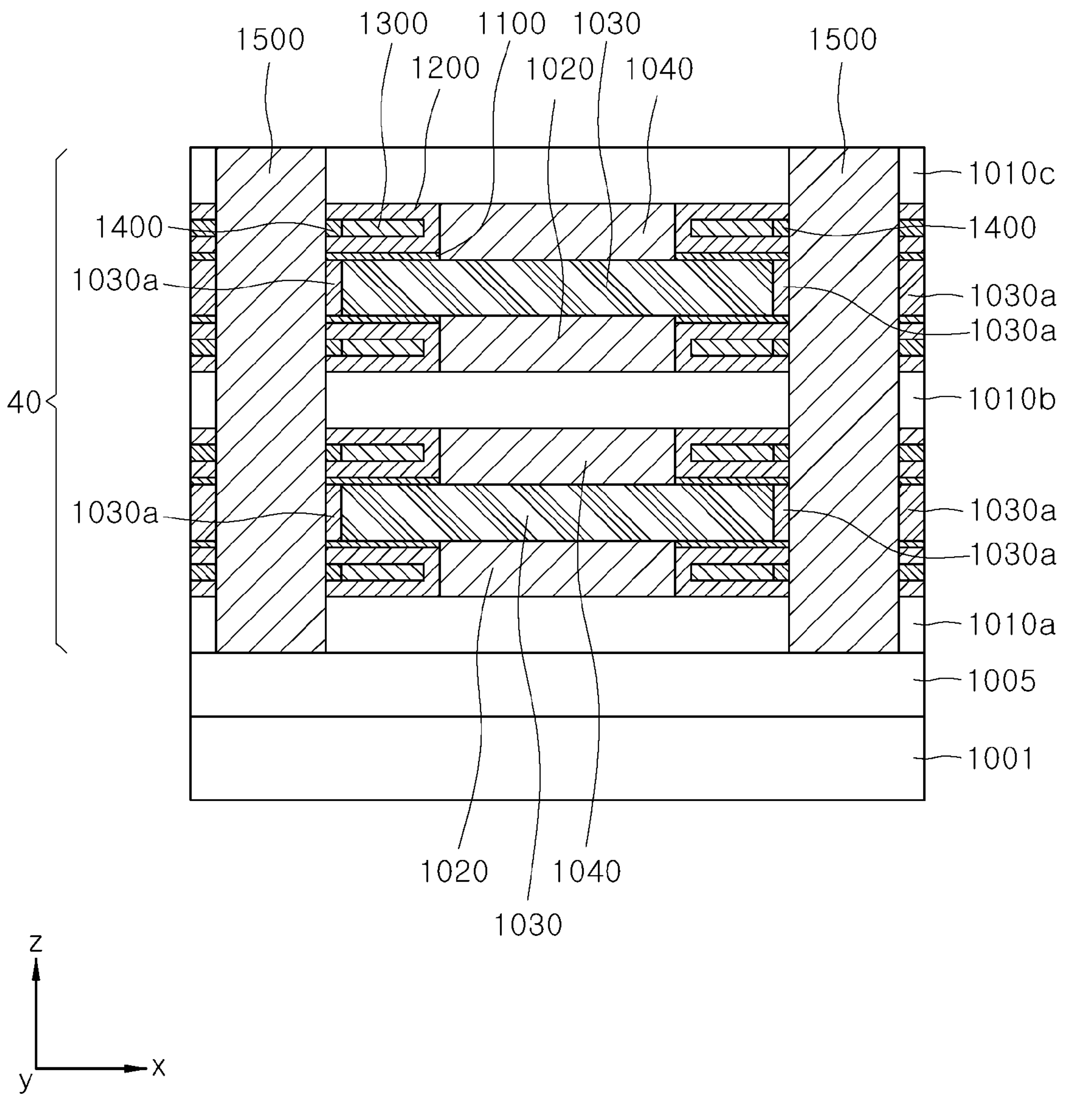

Referring to FIG. 14, the first trenches T1 in FIG. 13 may be filled with a conductive material to form bit line structures 1500. The bit line structures 1500 may be disposed to be spaced apart from the gate electrode layer 1300. For example, the bit line structures 1500 and the gate electrode layer 1300 may be electrically insulated from each other by the insulating material 1400. As described above, the fourth stack structure 40 including the bit line structures 1500 disposed inside the first trenches T1 may be formed by performing the processes related to FIG. 14.

Figure 15:
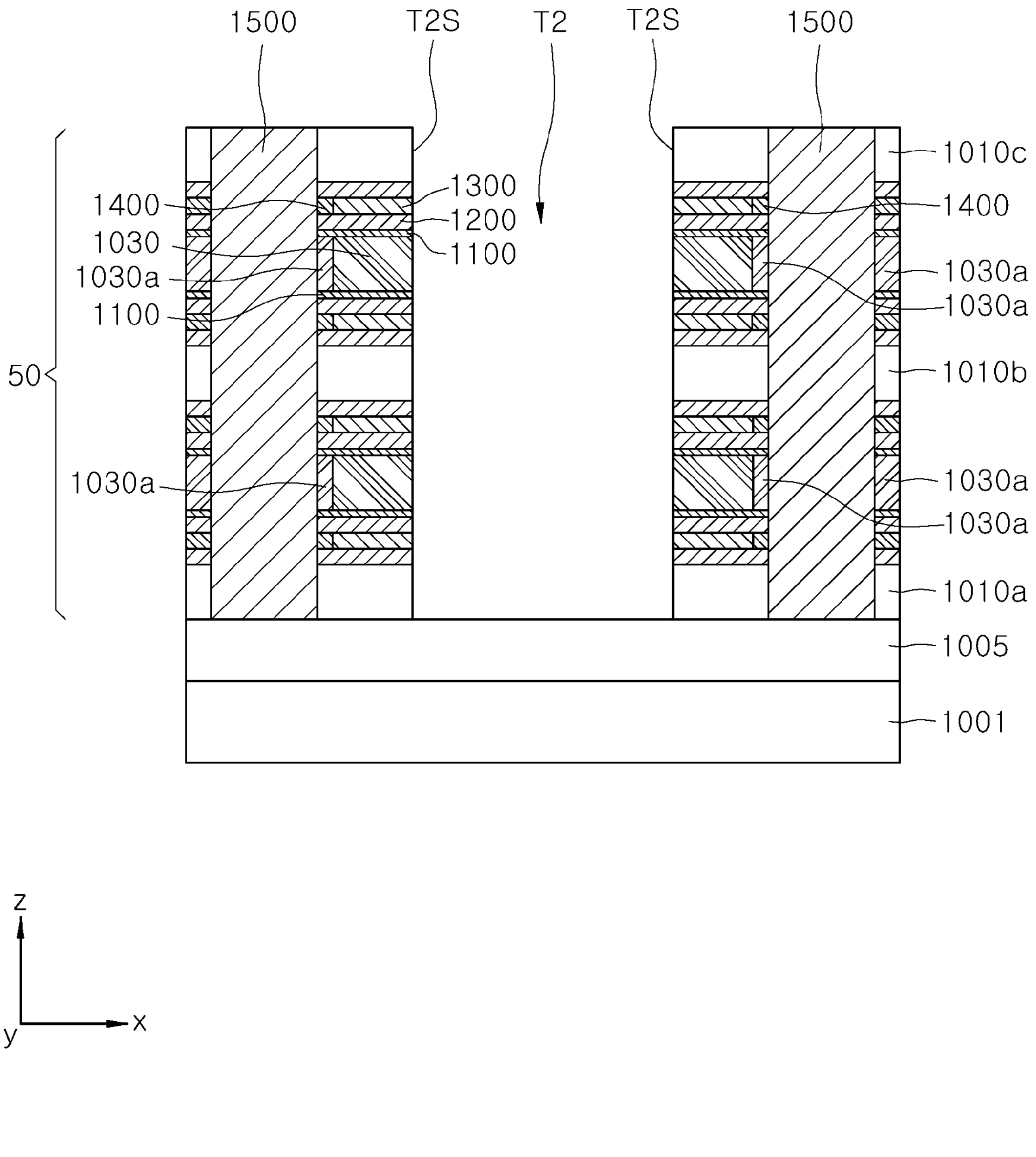

Referring to FIG. 15, the fourth stack structure 40 of FIG. 14 may be selectively etched to form a second trench T2 exposing the base insulating layer 1005. Specifically, the fourth stack structure 40 may be selectively etched using an anisotropic etching method. The second trench T2 may be disposed to be spaced apart from the bit line structures 1500.

The method of etching the fourth stack structure 40 by an anisotropic etching method may include removing portions of the first to third insulating layers 1010*a*, 1010*b*, and 1010*c*, the first and second sacrificial layers 1020 and 1040, and the semiconductor layers 1030, and removing portions of the interfacial insulating layers 1100, and the ferroelectric layers 1200 illustrated in FIG. 14.

Referring to FIG. 15, the second trench T2 may expose the semiconductor layers 1030, the interfacial insulating layers 1100, the ferroelectric layers 1200, the gate electrode layers 1300, and the first to third insulating layers 1010*a*, 1010*b*, and 1010*c* on the sidewall surface T2S of the second trench T2. As described above, the fifth stack structure 50 may be formed by performing the processes related to FIG. 15.

Figure 16:
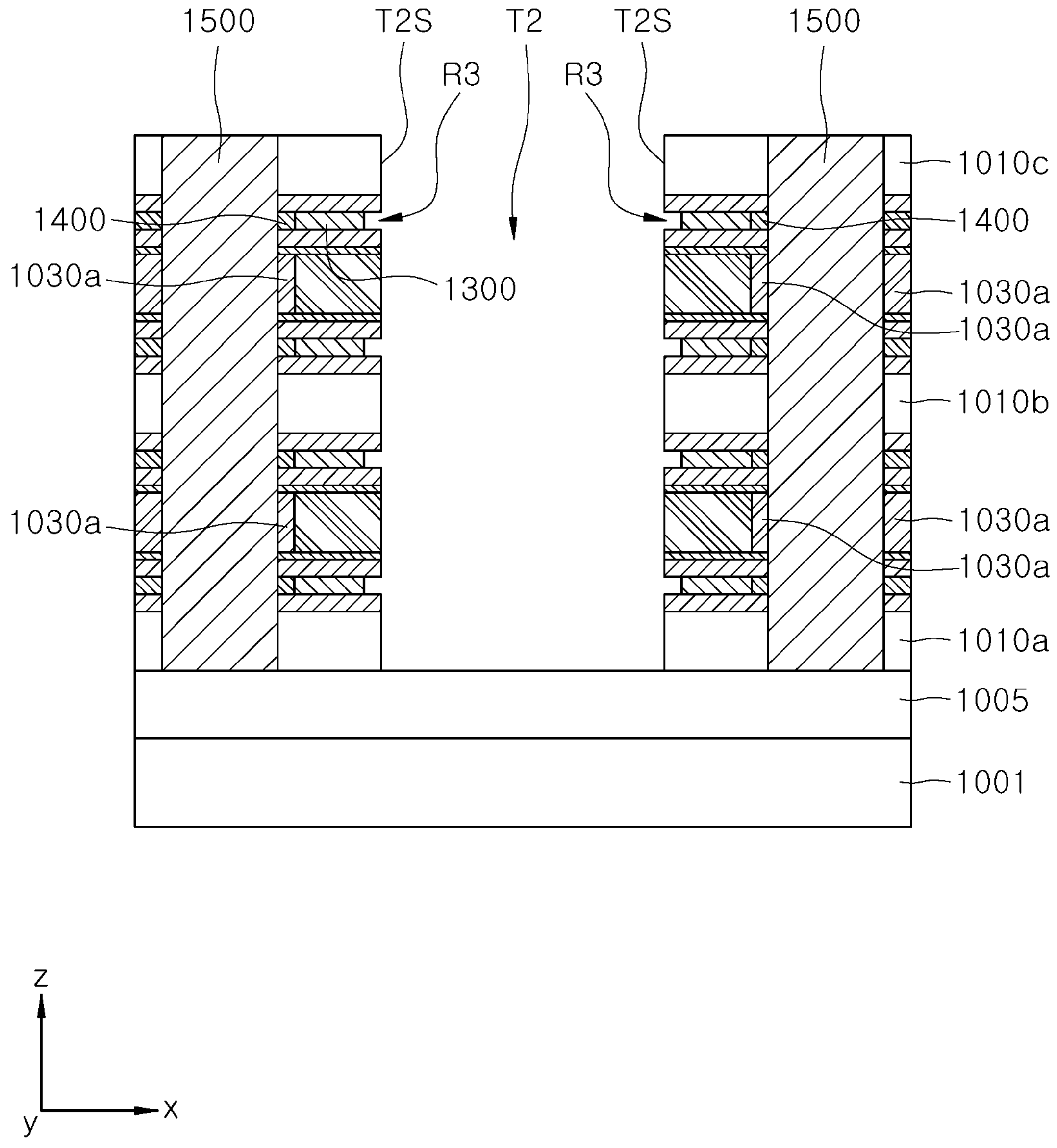

Referring to FIG. 16, the gate electrode layer 1300 exposed on the sidewall surface T2S of the second trench T2 may be selectively etched to form third recess spaces R3. The third recess spaces R3 may be formed by applying an isotropic etching method.

Figure 17:
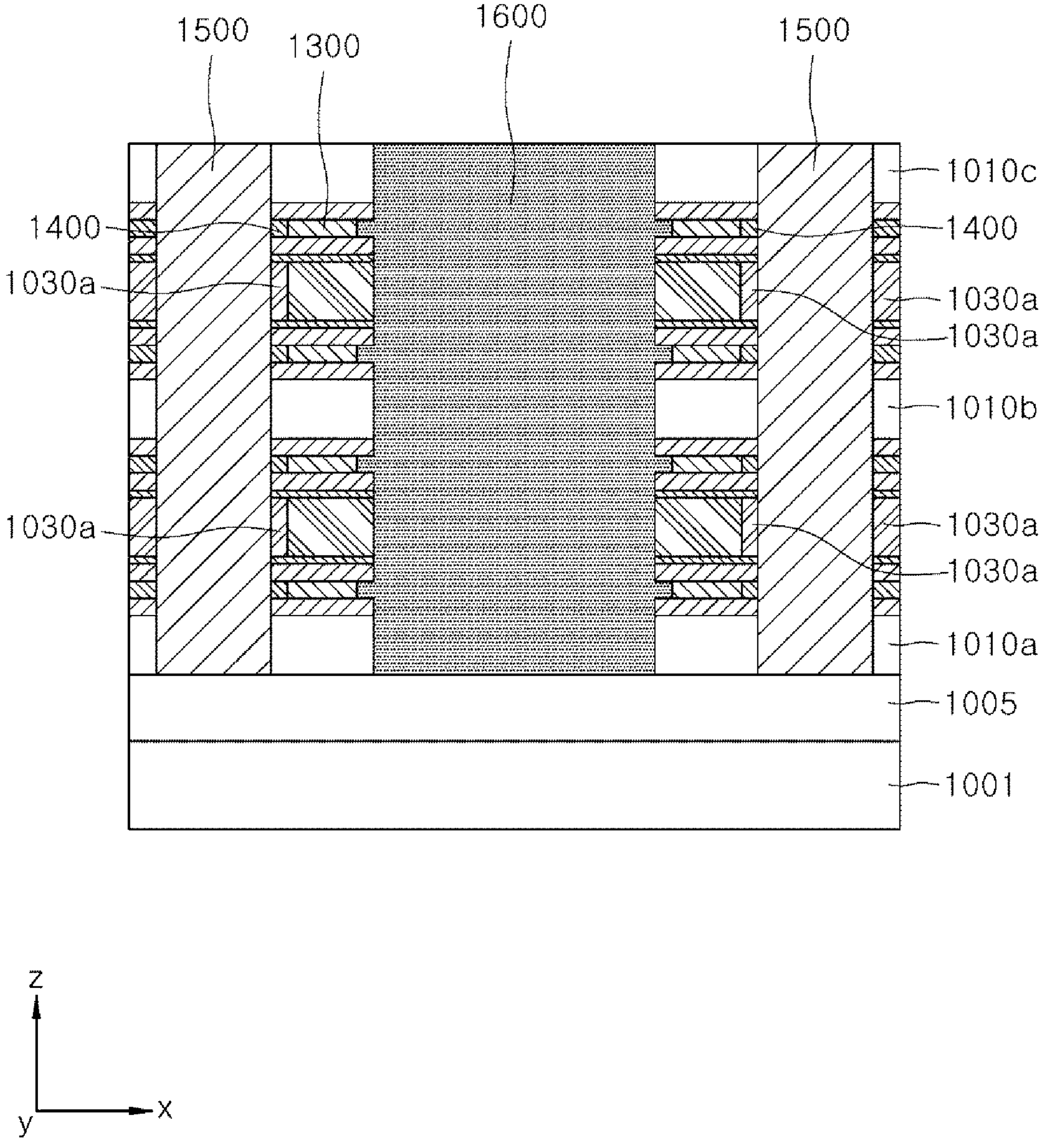
Figure 18:
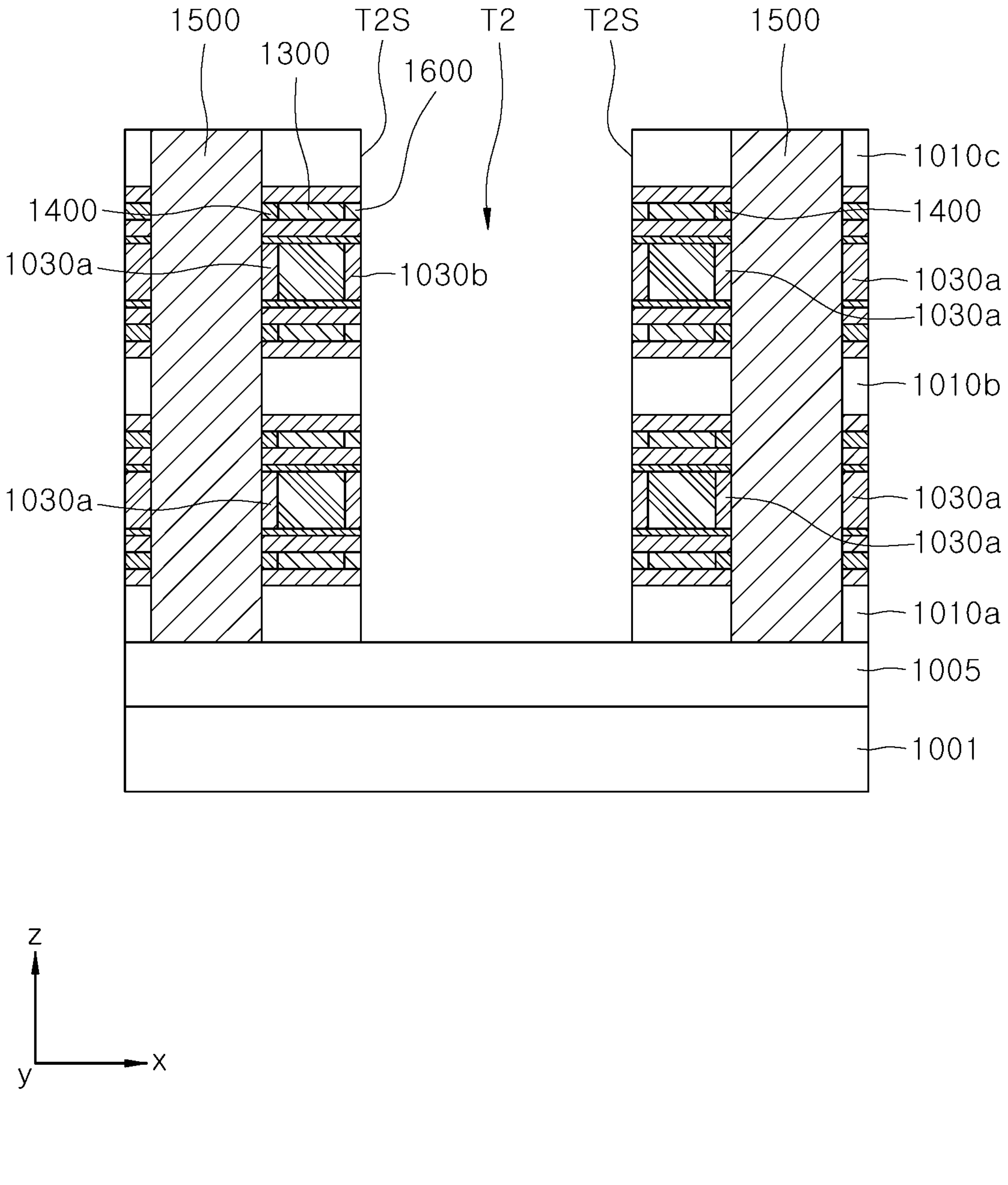

Referring to FIG. 17, the third recess spaces R3 and the second trench T2 illustrated in FIG. 16 may be filled with an insulating material 1600. Referring to FIG. 18, the insulating material 1600 inside the second trench T2 illustrated in FIG. 17 may be removed by applying an anisotropic etching method. Accordingly, the insulating material 1600 may remain in the third recess spaces (R3 of FIG. 16). In addition, second semiconductor doped regions 1030*b* may be formed by doping portions of the semiconductor layers 1030 exposed on the sidewall surface T2S of the second trench T2. As an example, the second semiconductor doped regions 1030*b* may be formed by implanting an n-type or p-type dopant using an ion implantation method.

Figure 19:
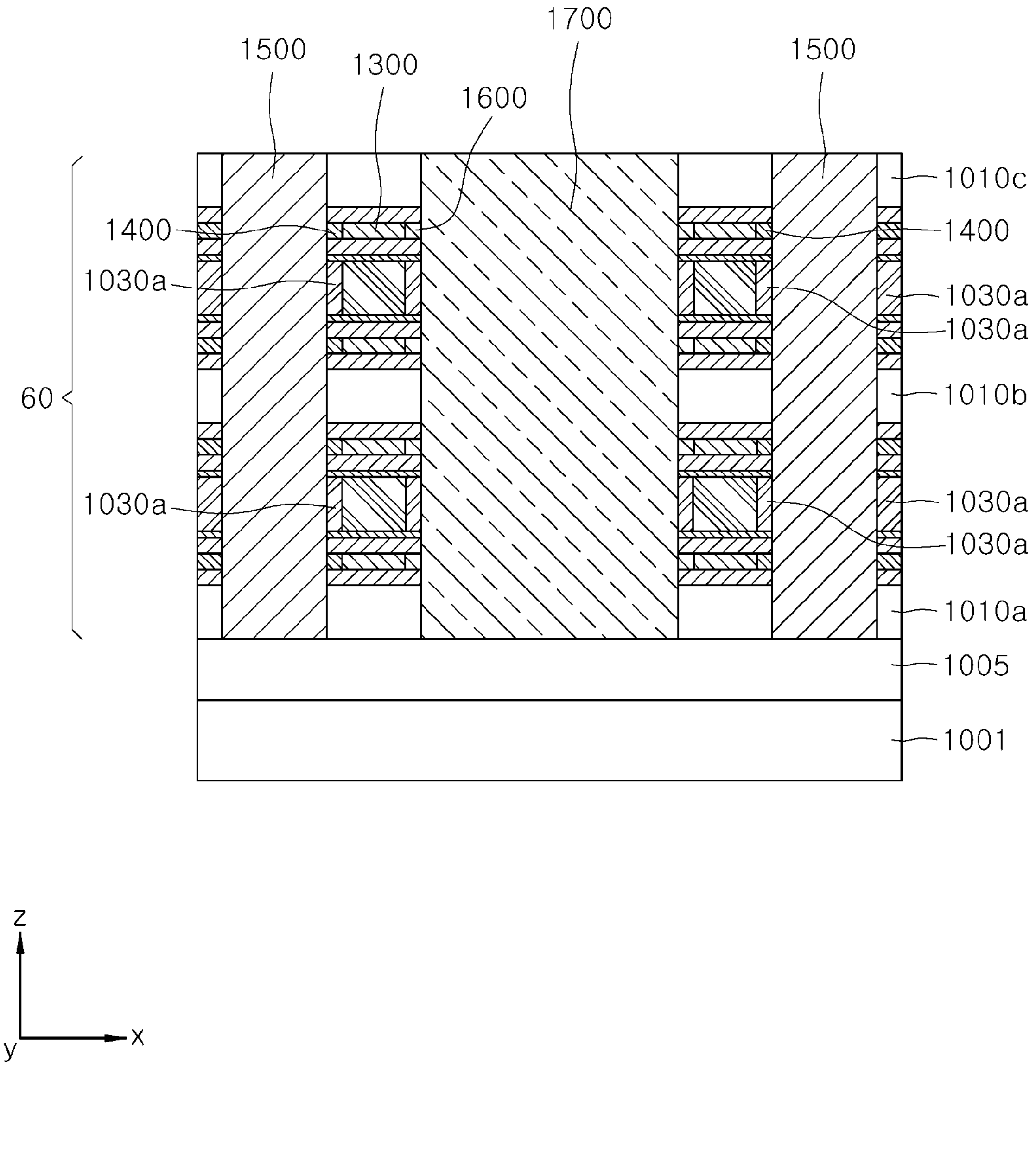
Figure 20:
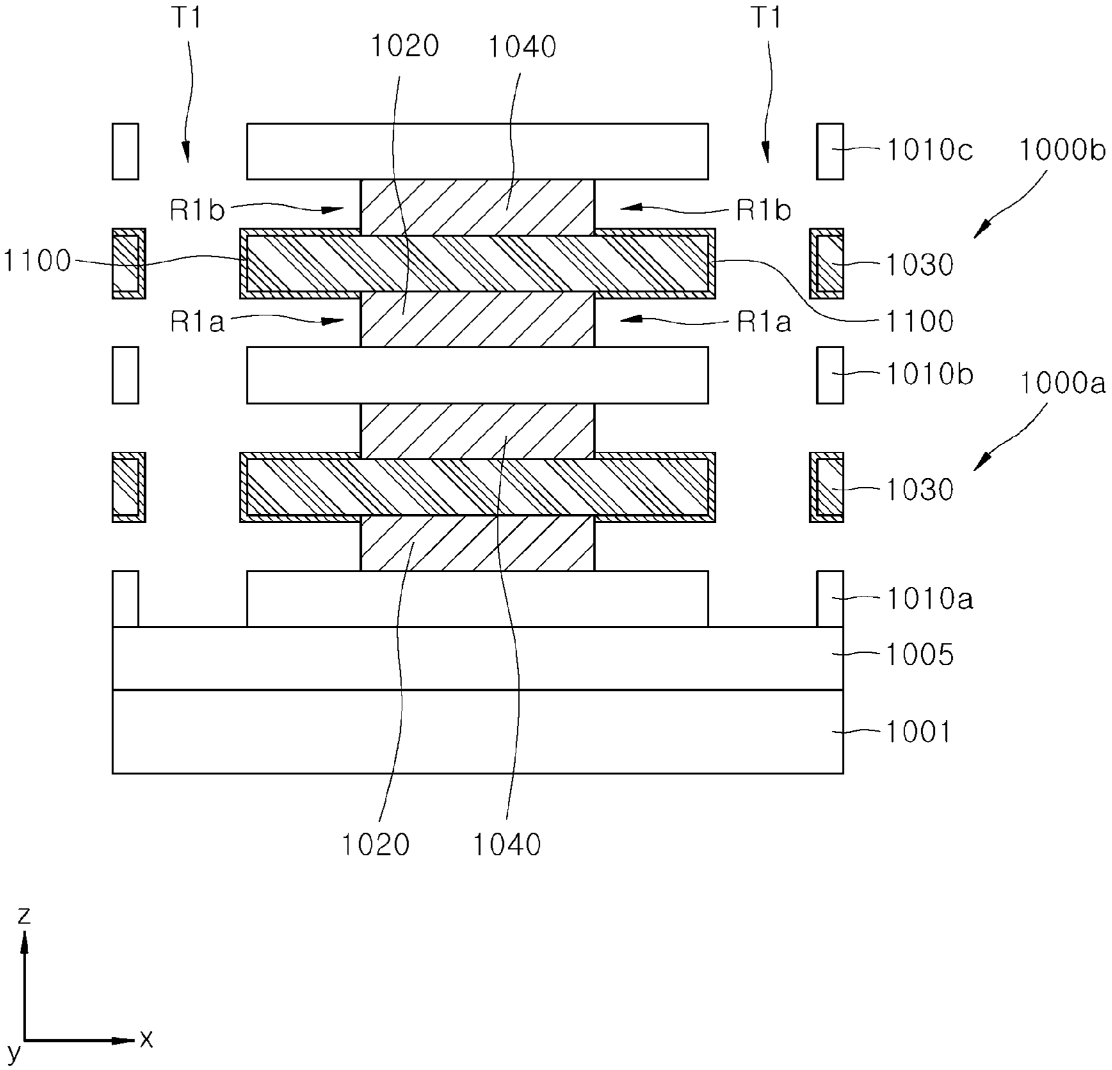
FIGS. 20 to 25 are schematic cross-sectional views illustrating a method of manufacturing a semiconductor device according to another embodiment of the present disclosure.

Referring to FIG. 19, the second trench T2 of FIG. 18 may be filled with a conductive material to form a source line structure 1700. The source line structure 1700 may be disposed to be spaced apart from the gate electrode layer 1300. For example, the source line structure 1700 and the gate electrode layer 1300 may be electrically insulated from each other by the insulating material 1600. As described above, the sixth stack structure 60 may be formed by performing the processes related to FIGS. 16 to 19. As a result, a semiconductor device according to an embodiment of the present disclosure may be manufactured.

FIGS. 20 to 25 are schematic cross-sectional views illustrating a method of manufacturing a semiconductor device according to another embodiment of the present disclosure. The methods described with reference to FIGS. 20 to 25 may be used in a method of manufacturing a semiconductor device 1*b* described with reference to FIGS. 3A and 3B.

First, the processes described above with reference to FIGS. 5 to 8 may be performed. As a result, a stack structure illustrated in FIG. 20 may be manufactured. The stack structure of FIG. 20 may be a structure in which an interfacial insulating material layer 1100 is formed on a semiconductor layer 1030 after first recess spaces R1*a* and R1*b* are formed in the second stack structure 20 illustrated in FIG. 7.

Figure 21:
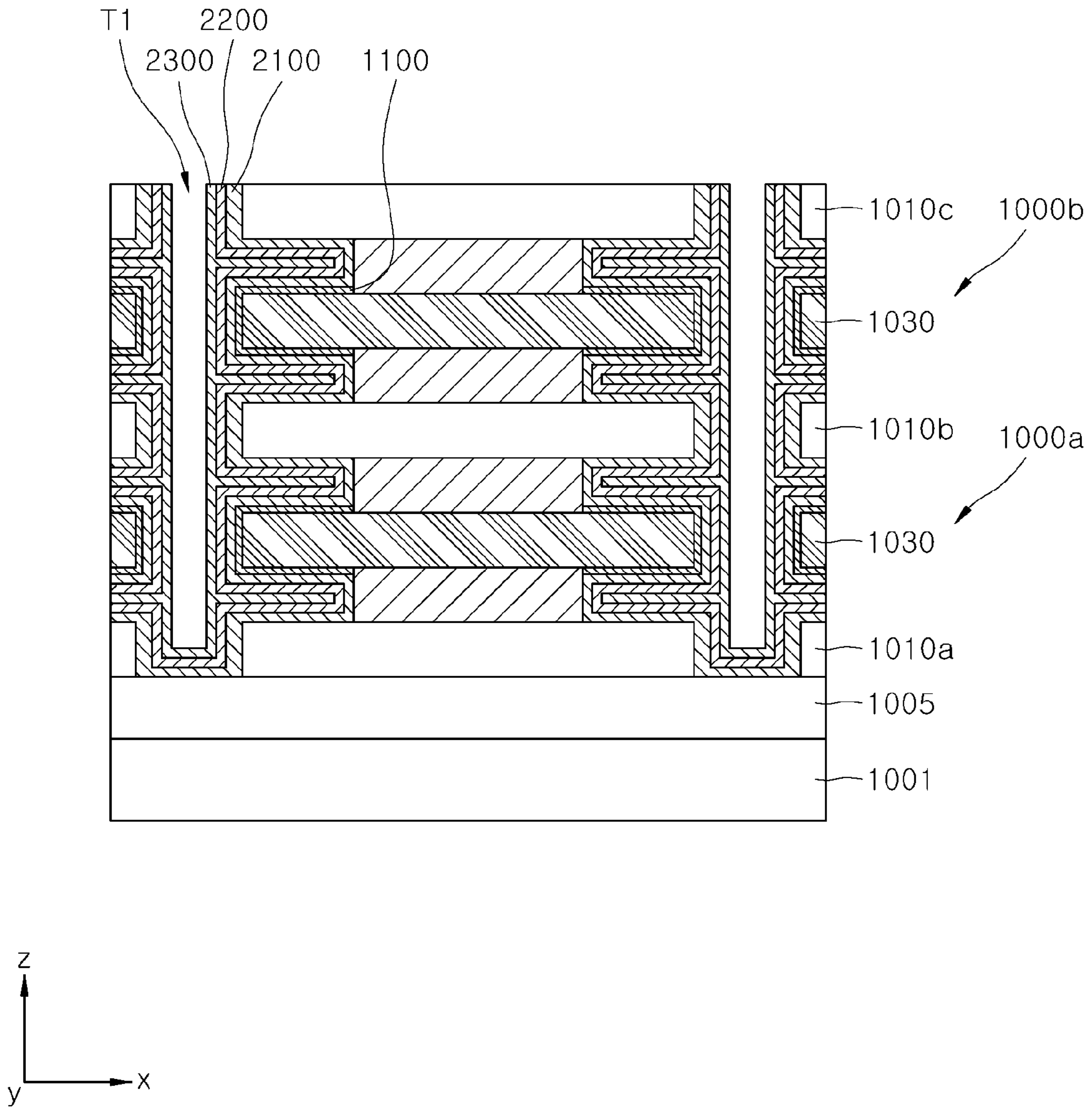

Referring to FIG. 21, a conductive material layer 2100 may be formed along the inner surfaces of the first trenches T1. Subsequently, a ferroelectric layer 2200 may be formed on the conductive material layer 2100. A gate electrode layer 2300 may be formed on the ferroelectric layer 2200.

The conductive material layer 2100 may be formed of or include, for example, metal, conductive metal nitride, or conductive metal oxide. The ferroelectric layer 2200 and the gate electrode layer 2300 may be substantially the same as the ferroelectric layer 1200 and the gate electrode layer 1300 of the methods described above with reference to FIGS. 5 to 19, respectively. The conductive material layer 2100, the ferroelectric layer 2200, and the gate electrode layer 2300 may be formed by applying, for example, a chemical vapor deposition method, a sputtering method, an atomic layer deposition method, or the like.

Figure 22:
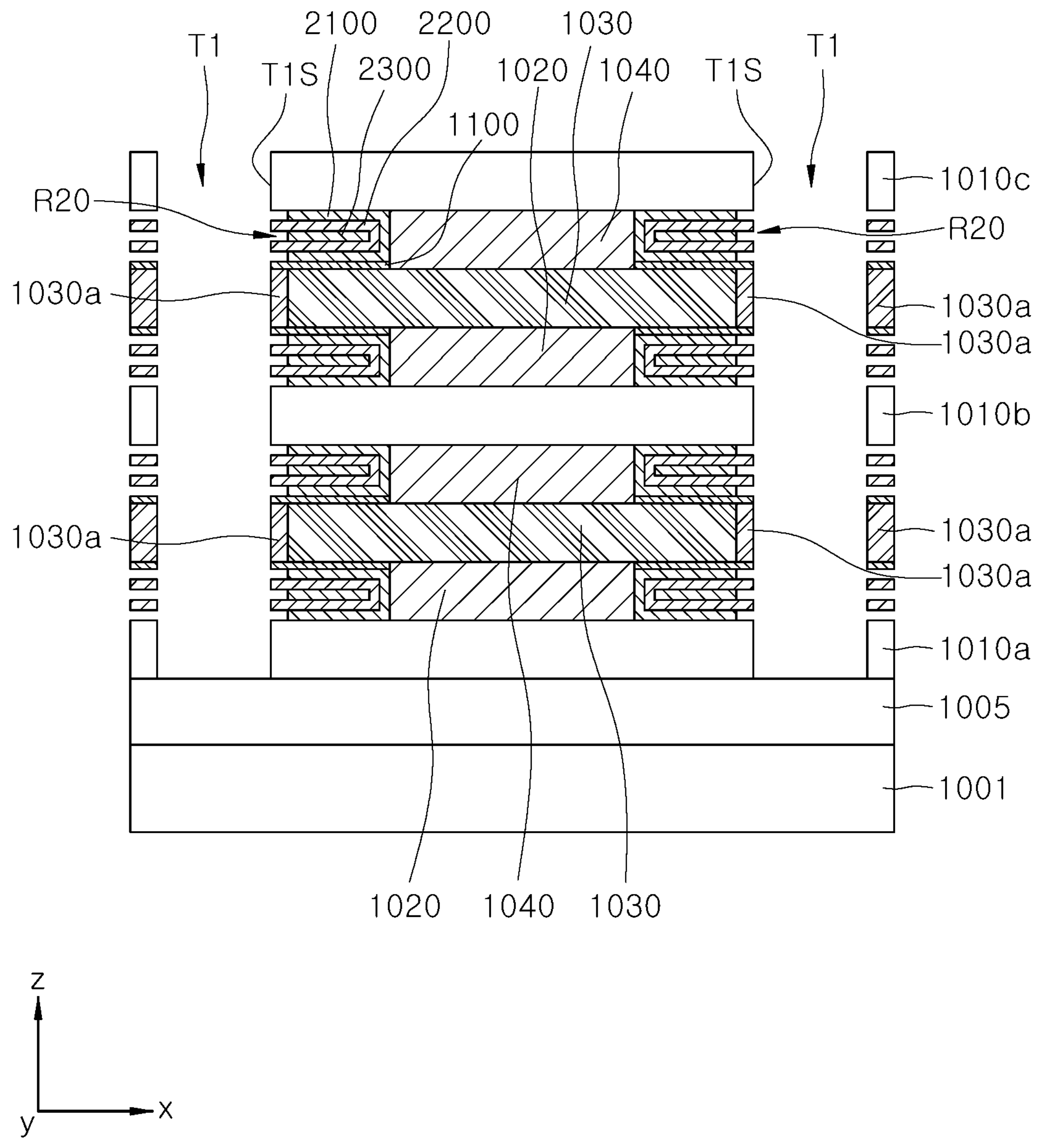

Referring to FIG. 22, substantially the same processes as the anisotropic etching method and the isotropic etching method described above with reference to FIGS. 10 and 11 may be performed with respect to the stack structure of FIG. 21. That is, the interfacial insulating layer 1100, the conductive material layer 2100, the ferroelectric layer 2200, and the gate electrode layer 2300 inside the first trenches T1 may be selectively removed by applying an anisotropic etching method. Subsequently, the conductive material layers 2100 and the gate electrode layers 2300 exposed on the sidewall surfaces T1S of the first trenches T1 may be selectively etched by applying an isotropic etching method to form recess spaces R20. In addition, portions of the semiconductor layers 1030 exposed on the sidewall surfaces T1S of the first trenches T1 may be doped to form first semiconductor doped regions 1030*a*.

Figure 23:
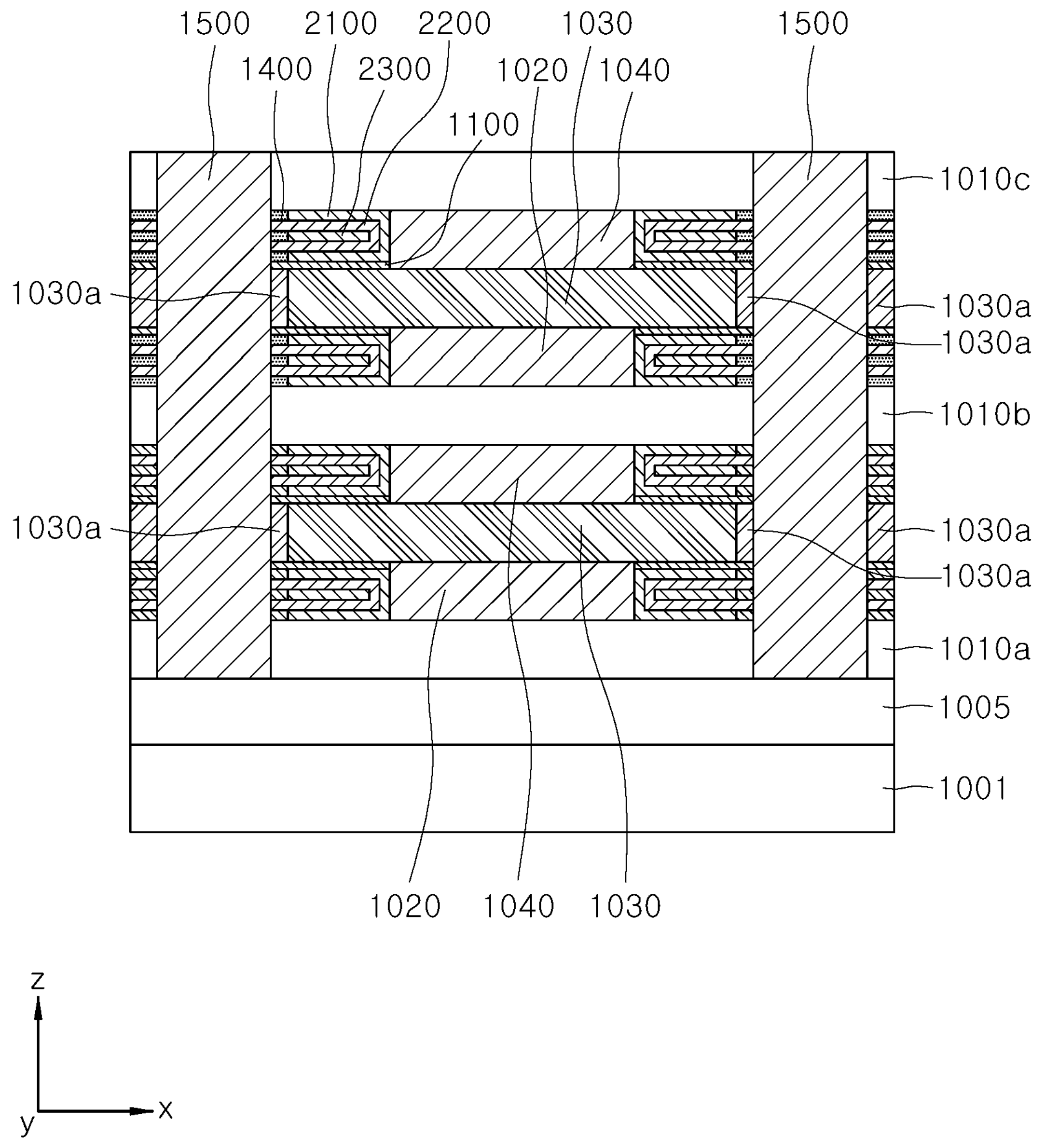

Referring to FIG. 23, by sequentially performing substantially the same processes as those described with reference to FIGS. 12 to 14, the recess spaces R20 may be filled with an insulating material 1400 and bit line structures 1500 may be formed inside the first trenches T1 of FIG. 22.

Figure 24:
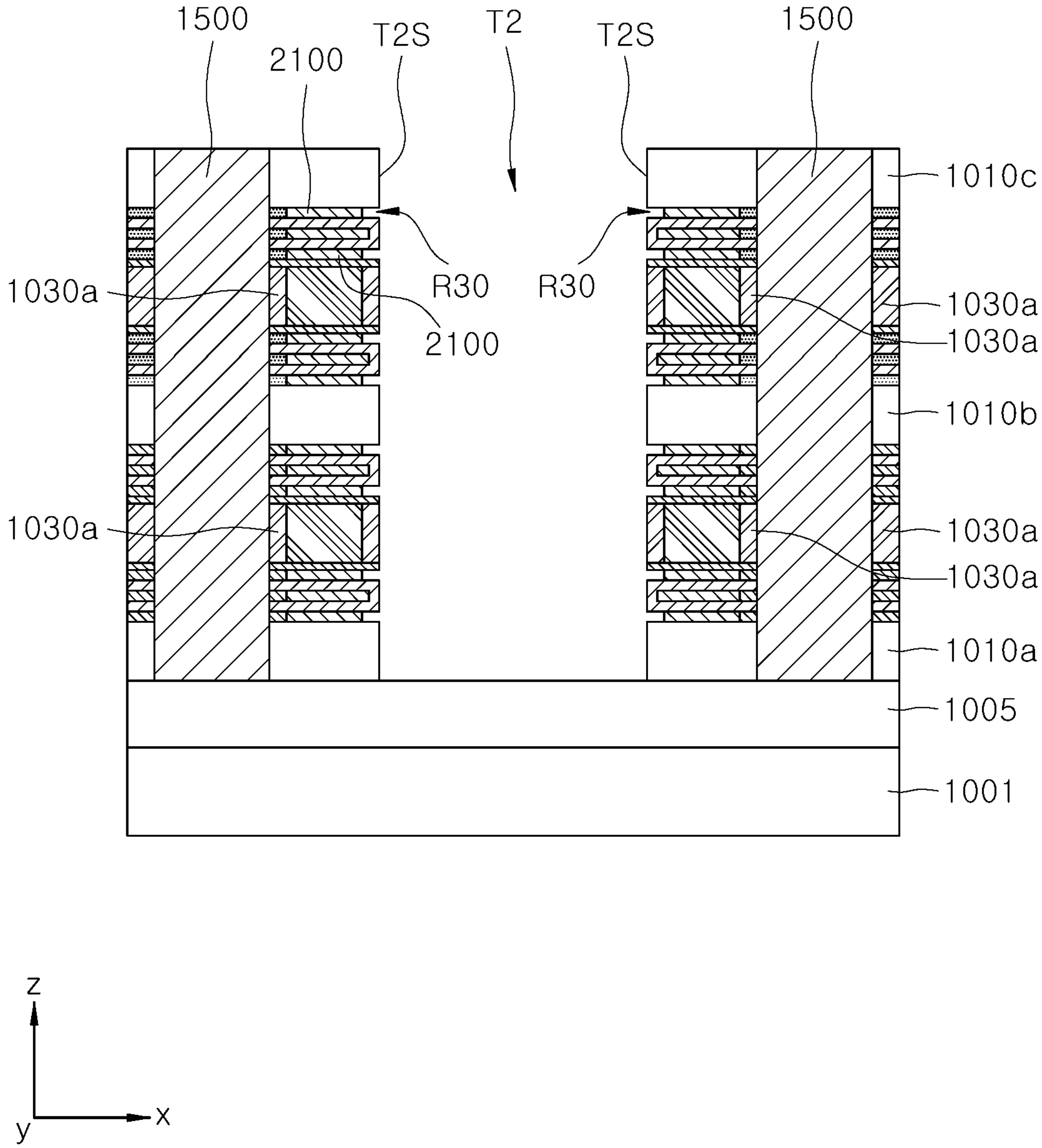

Referring to FIG. 24, substantially the same processes as the anisotropic etching method and the isotropic etching method described with reference to FIGS. 15 and 16 may be sequentially performed. That is, a second trench T2 exposing a base insulating layer 1005 may be formed by selectively etching the stack structure of FIG. 23 using an anisotropic etching method. Subsequently, recess spaces R30 may be formed by selectively etching the conductive material layers 2100 exposed on the sidewall surface T2S of the second trench T2 by applying an isotropic etching method.

Figure 25:
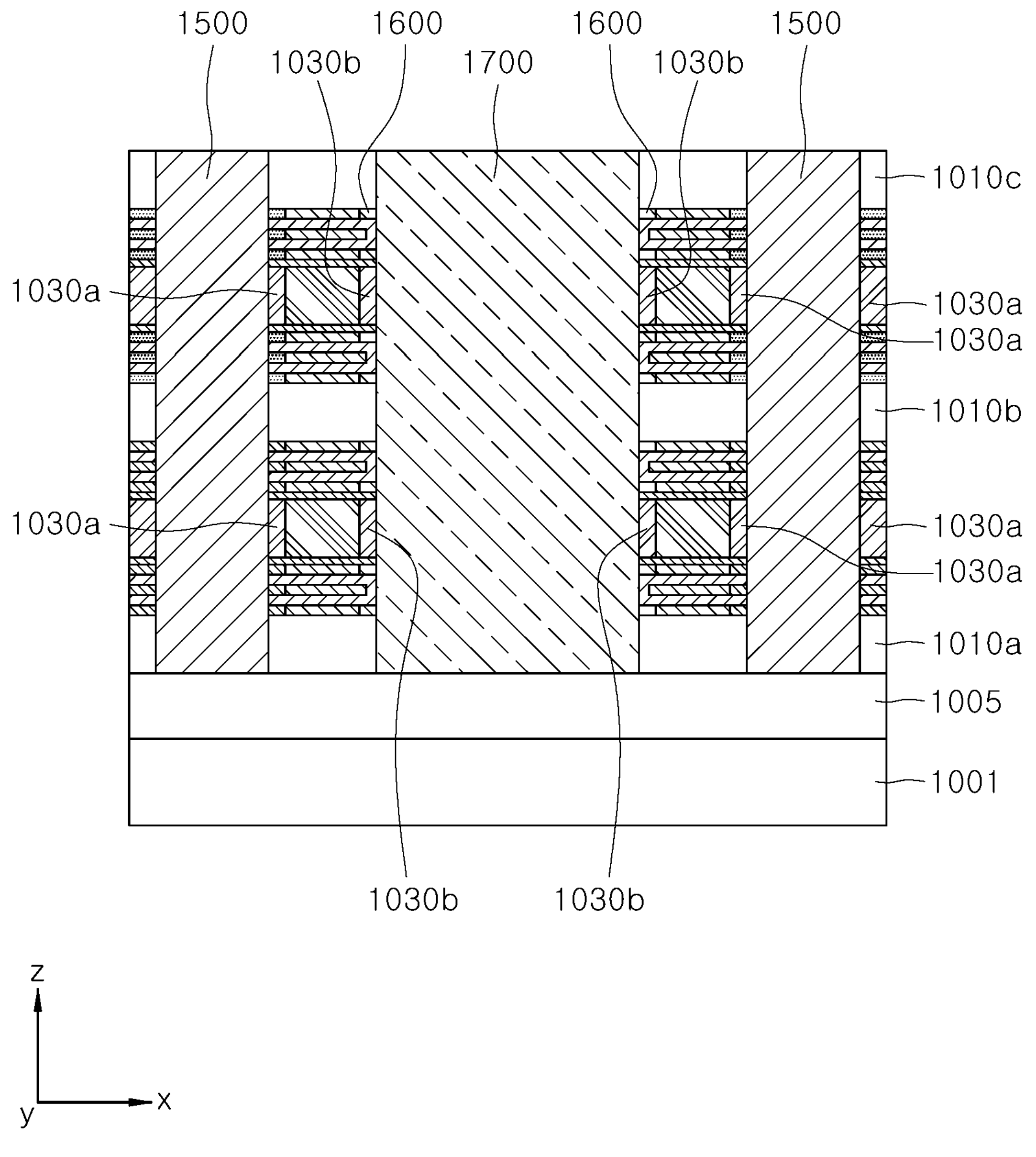

Referring to FIG. 25, substantially the same processes as those described with reference to FIGS. 17 to 19 may be sequentially performed. The recess spaces R30 and the second trench T2 of FIG. 24 may be filled with an insulating material 1600, after which the insulating material 1600 inside the second trench T2 may be removed by applying an anisotropic etching method. Subsequently, portions of the semiconductor layers 1030 exposed on the sidewall surfaces T2S of the second trench T2 may be doped to form second semiconductor doped regions 1030*b*. Subsequently, source line structures 1700 may be formed in the second trench T2. As a result, a semiconductor device according to an embodiment of the present disclosure may be manufactured.

FIGS. 26 to 30 are schematic cross-sectional views illustrating a method of manufacturing a semiconductor device according to yet another embodiment of the present disclosure. The methods described with reference to FIGS. 26 to 30 may be applied to a method of manufacturing the semiconductor device 1*c* described with reference to FIGS. 4A and 4B.

Figure 26:
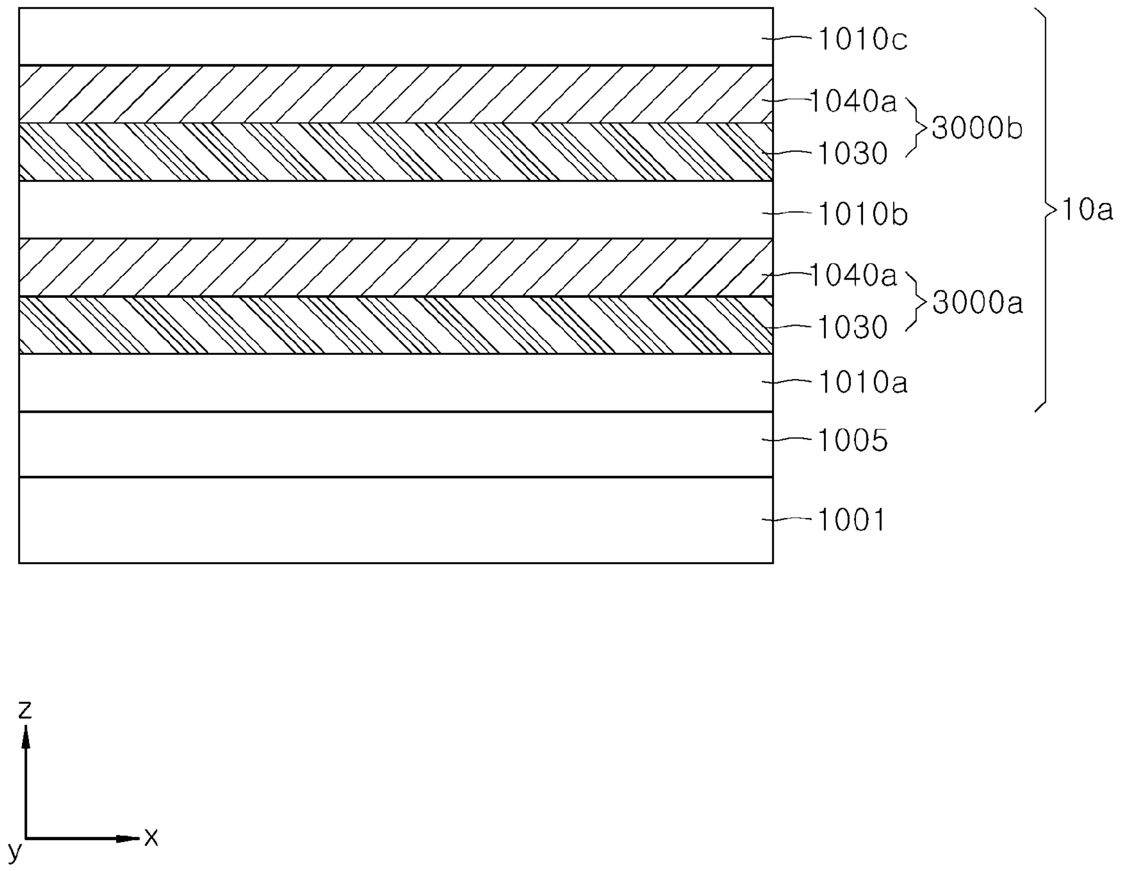
FIGS. 26 to 30 are schematic cross-sectional views illustrating a method of manufacturing a semiconductor device according to yet another embodiment of the present disclosure.

Referring to FIG. 26, a substrate 1001 may be provided. A base insulating layer 1005 may be formed on the substrate 1001. A first insulating layer 1010*a* may be formed on the base insulating layer 1005. A first sub-structure 3000*a* may be formed on the first insulating layer 1010*a*. The first sub-structure 3000*a* may include a semiconductor layer 1030 formed on the first insulating layer 1010*a* and a sacrificial layer 1040*a* formed on the semiconductor layer 1030. In the first sub-structure 3000*a* of FIG. 26, a sacrificial layer is not disposed between the first insulating layer 1010*a* and the semiconductor layer 1030, as compared to the first sub-structure 1000*a* of FIG. 5.

Subsequently, a second insulating layer 1010*b* may be formed on the first sub-structure 3000*a*. A second sub-structure 3000*b* may be formed on the second insulating layer 1010*b*. The configuration of the second sub-structure 3000*b* may be substantially the same as that of the first sub-structure 3000*a*. A third insulating layer 1010*c* may be formed on the second sub-structure 3000*b*. As a result, a first stack structure 10*a* may be formed on the base insulating layer 1005.

Figure 27:
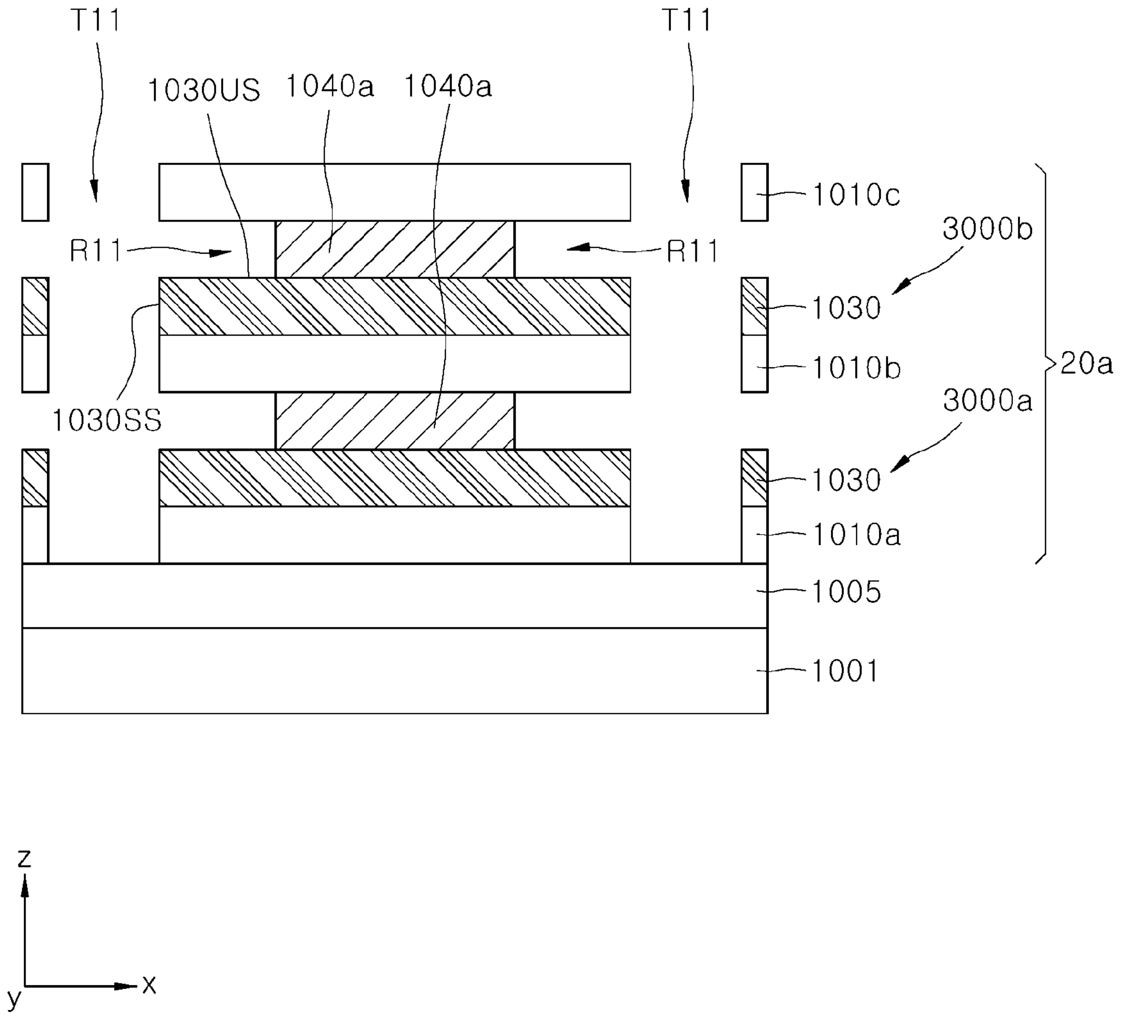

Referring to FIG. 27, substantially the same processes as those described above with reference to FIGS. 6 and 7 may be sequentially performed with respect to the first stack structure 10*a*. That is, trenches T11 exposing the base insulating layer 1005 may be formed by selectively etching the first stack structure 10*a* on the base insulating layer 1005. Subsequently, the sacrificial layer 1040*a* exposed on the sidewall surfaces of the trenches T11 may be selectively etched to form recess spaces R11. Accordingly, a second stack structure 20*a* may be formed.

Because the sacrificial layer 1040*a* is formed only on a surface of the semiconductor layer 1030 in each of the first and second sub-structures 3000*a* and 3000*b* of the first stack structure 10*a* of FIG. 26, portions of upper surfaces 1030US and side surfaces 1030US of the semiconductor layer 1030 may be exposed after formation of the recess spaces R11, as illustrated in FIG. 27.

Figure 28:
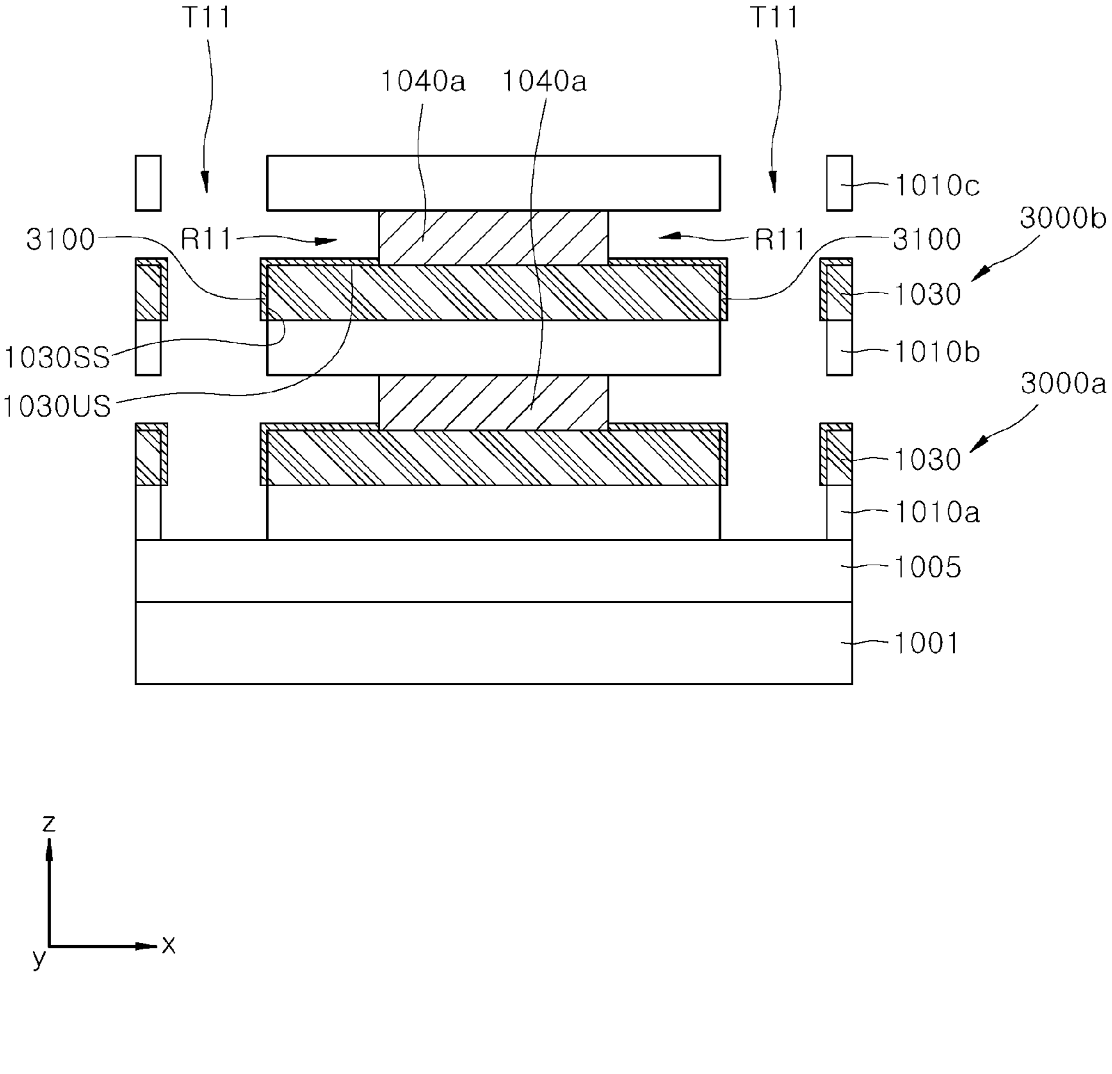

Referring to FIG. 28, an interfacial insulating layer 3100 may be formed on the portions of the upper surfaces 1030US and the side surfaces 1030US of the semiconductor layer 1030. The interfacial insulating layer 3100 may be formed of substantially the same material as the interfacial insulating layer 1100 of FIG. 8.

Figure 29:
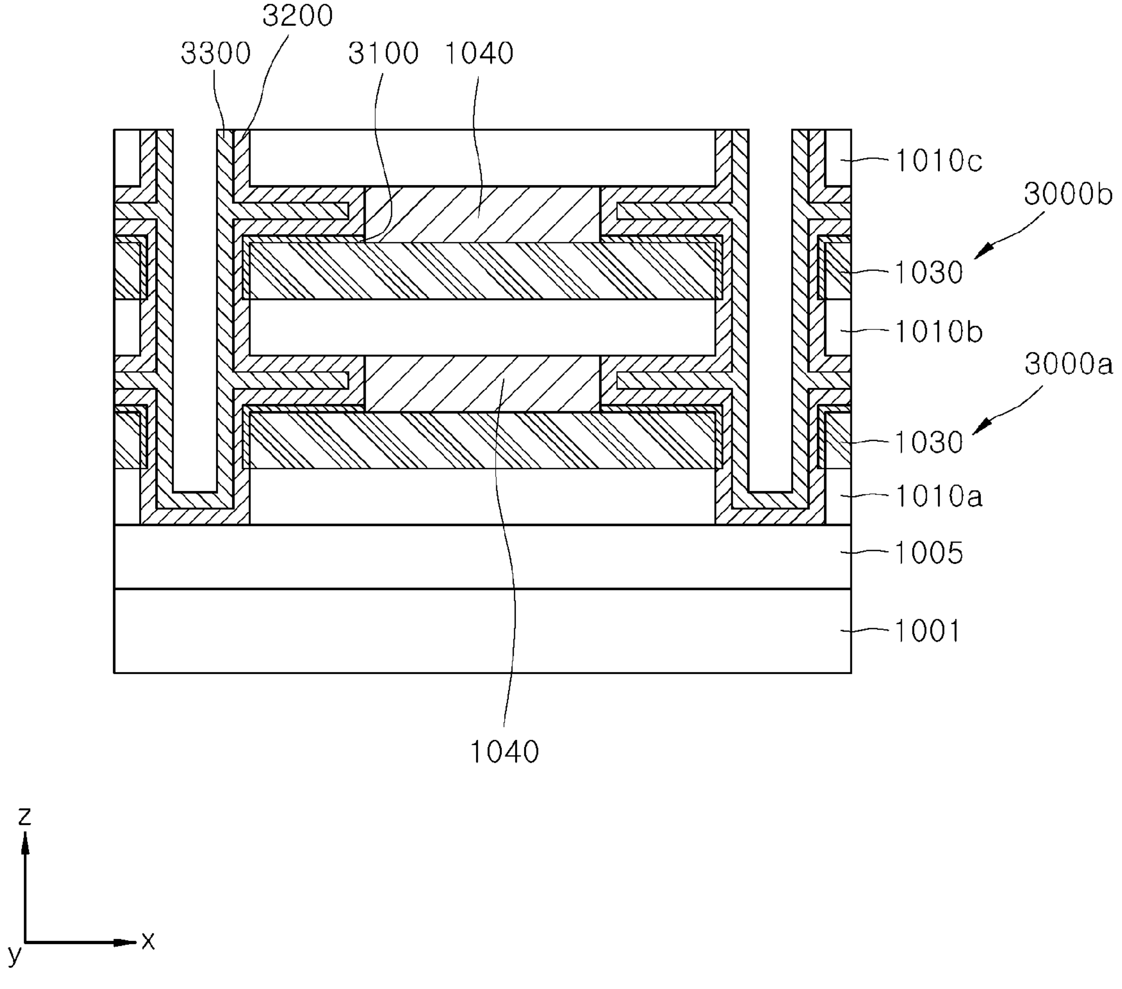

Referring to FIG. 29, substantially the same process as that described above with reference to FIG. 9 may be performed. That is, a ferroelectric layer 3200 may be formed along the inner surfaces of the trenches T11 of FIG. 28. A gate electrode layer 3300 may be formed on the ferroelectric layer 3200. The ferroelectric layer 3200 and the gate electrode layer 3300 may be made of substantially the same materials as the ferroelectric layer 1200 and the gate electrode layer 1300 of FIG. 9, respectively.

Figure 30:
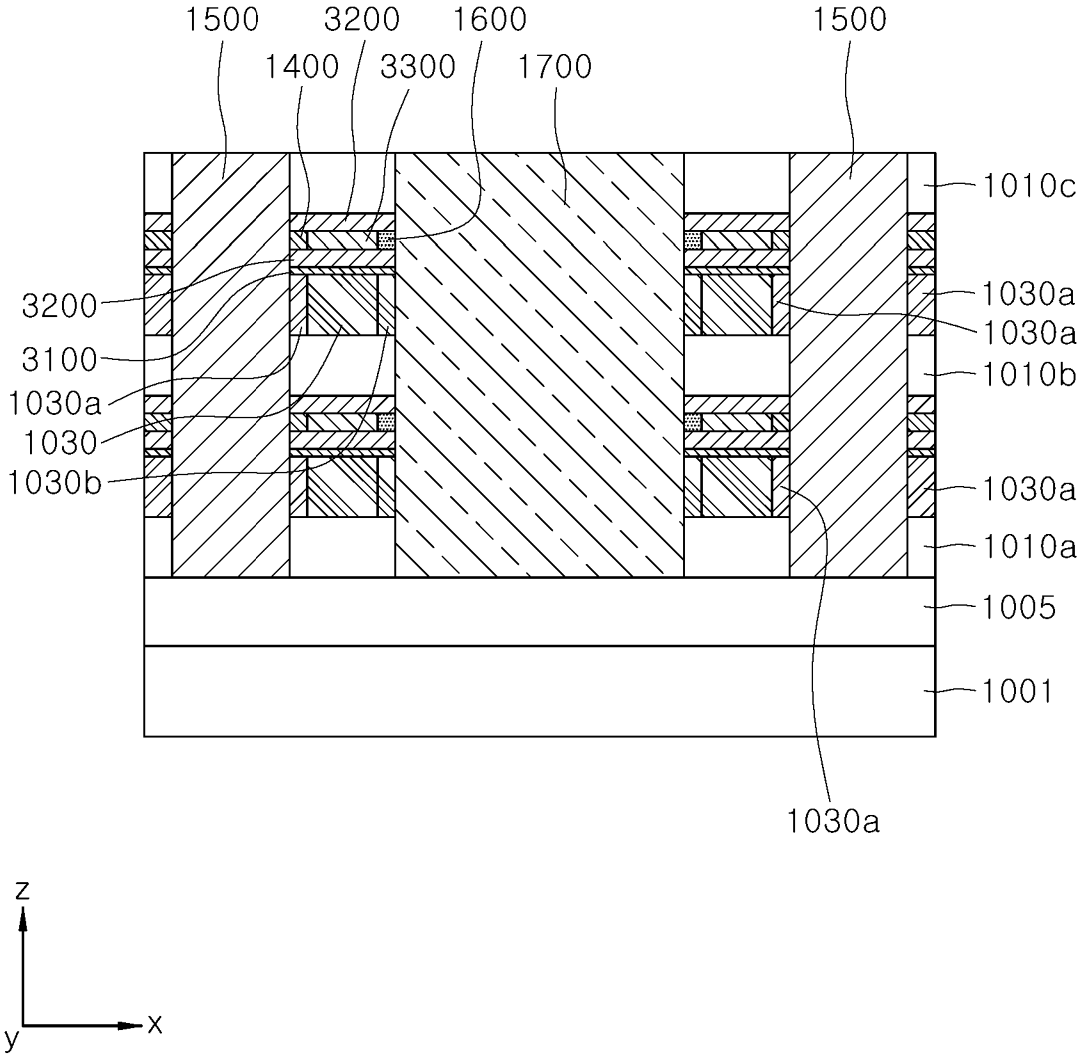

Subsequently, substantially the same processes as those described above with reference to FIGS. 10 to 19 may be sequentially performed. As a result, as illustrated in FIG. 30, a semiconductor device according to an embodiment of the present disclosure may be manufactured.

Embodiments of the present disclosure have been disclosed for illustrative purposes. Those skilled in the art will appreciate that various modifications, additions, and substitutions are possible, without departing from the scope and spirit of the present disclosure and the accompanying claims.

What is claimed is:

1. A semiconductor device comprising:

a substrate;

a bit line structure and a source line structure each extending in a direction perpendicular to a surface of the substrate;

a semiconductor layer disposed between the bit line structure and the source line structure on a plane parallel to the surface of the substrate;

a first ferroelectric layer disposed on a first surface of the semiconductor layer; and a first gate electrode layer disposed on the first ferroelectric layer, wherein the semiconductor layer, the first ferroelectric layer, and the first gate electrode layer are stacked along the direction perpendicular to the surface of the substrate.

2. The semiconductor device of claim 1, wherein the semiconductor layer is disposed to contact each of the bit line structure and the source line structure.

3. The semiconductor device of claim 1, wherein the semiconductor layer comprises:

a source region in contact with the bit line structure;

a drain region in contact with the source line structure; and a channel region disposed between the source region and the drain region.

4. The semiconductor device of claim 1, further comprising:

a second ferroelectric layer disposed on a second surface of the semiconductor layer opposite to the first surface; and a second gate electrode layer disposed on the second ferroelectric layer.

5. The semiconductor device of claim 4, wherein the first gate electrode layer and the second gate electrode layer are connected by a conductive via.

6. The semiconductor device of claim 4, wherein the first gate electrode layer and the second gate electrode layer are electrically separated from each other.

7. The semiconductor device of claim 1, further comprising a bit line insulating layer and a source line insulating layer disposed on sidewalls of the first gate electrode layer, wherein the bit line insulating layer electrically insulates the bit line structure from the first gate electrode layer, and the source line insulating layer electrically insulates the source line structure from the first gate electrode layer.

8. The semiconductor device of claim 1, further comprising an interfacial insulating layer disposed between the semiconductor layer and the first ferroelectric layer.

9. The semiconductor device of claim 1, further comprising an electrically floating layer disposed between the semiconductor layer and the first ferroelectric layer, wherein the electrically floating layer has electrical conductivity.

10. A semiconductor device comprising:

a substrate;

a bit line structure and a source line structure each extending in a direction perpendicular to a surface of the substrate; and a plurality of unit cell structures electrically connected to the bit line structure and the source line structure, wherein each of the plurality of unit cell structures comprises:

a semiconductor layer disposed on a plane parallel to the surface of the substrate and in contact with the bit line structure and the source line structure;

a first ferroelectric layer disposed on a first surface of the semiconductor layer; and a first gate electrode layer disposed on the first ferroelectric layer and spaced apart from the bit line structure and the source line structure, wherein the plurality of unit cell structures are disposed to be spaced apart from each other in a direction perpendicular to the surface of the substrate, wherein the semiconductor layer, the first ferroelectric layer, and the first gate electrode layer are stacked along the direction perpendicular to the surface of the substrate.

11. The semiconductor device of claim 10, wherein the semiconductor layer comprises:

a source region in contact with the bit line structure;

a drain region in contact with the source line structure; and a channel region disposed between the source region and the drain region.

12. The semiconductor device of claim 10, further comprising:

a second ferroelectric layer disposed on a second surface of the semiconductor layer opposite to the first surface; and a second gate electrode layer disposed on the second ferroelectric layer and spaced apart from the bit line structure and the source line structure.

13. The semiconductor device of claim 10, further comprising an interfacial insulating layer disposed between the semiconductor layer and the first ferroelectric layer.

14. The semiconductor device of claim 10, further comprising an electrically floating layer disposed between the semiconductor layer and the first ferroelectric layer, wherein the electrically floating layer has electrical conductivity.

* * * * *